(12) United States Patent
Iwabuchi et al.

(10) Patent No.: US 8,049,293 B2
(45) Date of Patent: Nov. 1, 2011

(54) SOLID-STATE IMAGE PICKUP DEVICE, ELECTRONIC APPARATUS USING SUCH SOLID-STATE IMAGE PICKUP DEVICE AND METHOD OF MANUFACTURING SOLID-STATE IMAGE PICKUP DEVICE

(75) Inventors: Shin Iwabuchi, Kanagawa (JP); Kazuhide Yokota, Kanagawa (JP); Takeshi Yanagita, Tokyo (JP); Yasushi Maruyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 670 days.

(21) Appl. No.: 11/368,756

(22) Filed: Mar. 6, 2006

(65) Prior Publication Data

US 2006/0197007 A1   Sep. 7, 2006

(30) Foreign Application Priority Data

Mar. 7, 2005 (JP) .................. P2005-062714
Jun. 2, 2005 (JP) .................. P2005-163267
Jan. 20, 2006 (JP) .................. P2006-012106

(51) Int. Cl.
*H01L 31/00* (2006.01)
*H01L 27/148* (2006.01)
*H01L 31/062* (2006.01)
*H01L 31/113* (2006.01)
*H01L 21/00* (2006.01)

(52) U.S. Cl. ........ 257/460; 257/228; 257/292; 257/447; 257/E31.032

(58) Field of Classification Search ............ 257/228, 257/447, 460, 463, 291–292, E31.032
See application file for complete search history.

(56) References Cited

FOREIGN PATENT DOCUMENTS

| JP | 07-245386 | 9/1995 |
| JP | 2001-257337 | 9/2001 |
| JP | 2003-338615 | 11/2003 |

*Primary Examiner* — Matthew Landau
*Assistant Examiner* — Daniel Luke
(74) *Attorney, Agent, or Firm* — Rader, Fishman & Grauer PLLC

(57) ABSTRACT

A back-illuminated type solid-state image pickup device (1041) includes read circuits (Tr1, Tr2) formed on one surface of a semiconductor substrate (1042) to read a signal from a photo-electric conversion element (PD) formed on the semiconductor substrate (1042), in which electric charges (e) generated in a photo-electric conversion region (1052c1) formed under at least one portion of the read circuits (Tr1, Tr2) are collected to an electric charge accumulation region (1052a) formed on one surface side of the semiconductor substrate (1042) of the photo-electric conversion element (PD) by electric field formed within the photo-electric conversion element (PD). Thus, the solid-state image pickup device and the camera are able to make the size of pixel become very small without lowering a saturation electric charge amount (Qs) and sensitivity.

16 Claims, 16 Drawing Sheets

SOLID-STATE IMAGE PICKUP DEVICE, ELECTRONIC APPARATUS USING SUCH SOLID-STATE IMAGE PICKUP DEVICE AND METHOD OF MANUFACTURING SOLID-STATE IMAGE PICKUP DEVICE

CROSS REFERENCES TO RELATED APPLICATIONS

The present invention contains subject matter related to Japanese Patent Applications JP 2005-062714 filed in the Japanese Patent Office on Mar. 7, 2005, JP 2005-163267 filed in the Japanese Patent Office on Jun. 2, 2005 and JP 2006-012106 filed in the Japanese Patent Office on Jan. 20, 2006, the entire contents of which being incorporated herein by reference.

BACKGROUND OF THE INVENTION

1. Field of the Invention

The present invention generally relates to a solid-state image pickup device and more particularly to a back-illuminated type CMOS (complementary metal-oxide semiconductor) solid-state image pickup device in which incident light is introduced from the back side of a substrate, an electronic apparatus using such solid-state image pickup device and a method of manufacturing such solid-state image pickup device.

2. Description of the Related Art

A CMOS solid-state image pickup device is known as a solid-state image pickup device so far. This CMOS solid-state image pickup device includes a photodiode and a plurality of transistors, that is, MOS (metal-oxide semiconductor) transistors to form one pixel, a plurality of pixels being arrayed with a predetermined pattern. This photodiode is a photoelectric conversion element for generating and accumulating signal electric charges in response to a quantity of light received thereat. The MOS transistors are elements constructing a read circuit to read signal electric charges from the photodiode.

FIG. 1 of the accompanying drawings is a diagram showing an example of a related-art surface-illuminated type CMOS solid-state image pickup device which is applied to an image sensor. FIG. 1 shows a main portion of a pixel. As shown in FIG. 1, a CMOS solid-state image pickup device 1001 includes a first conductivity type, for example, n type silicon substrate 1002 on which a second conductivity type, for example, p type semiconductor well region 1003 is formed, a p type pixel separation region 1004 formed on the surface side of the substrate 1002 to divide each pixel and a unit pixel 1005 composed of a photodiode PD and a plurality of MOS transistors, for example, an electric charge read transistor Tr1, a reset transistor, an amplifier transistor and a vertical selection transistor (all of which are generally denoted by reference numeral Tr2). Many pixels 1005 are arrayed in a two-dimensional fashion.

As shown in FIG. 1, the photodiode PD is formed of a first conductivity type, for example, n type semiconductor region 1006 formed by implanting ions on the surface of the n type semiconductor substrate 1002 by a predetermined depth and a heavily-doped p type semiconductor region formed on the surface of the n type semiconductor region 1006, that is, a p type accumulation layer 1007 to suppress a dark current. The n type semiconductor region 1006 of the photodiode PD is comprised of a heavily-doped n type charge accumulation region ($n^+$ charge accumulation region) 1006a on the surface adjoining to the $p^+$ accumulation layer 1007 and an n type semiconductor region 1006b having an impurity concentration lower than that of the n type charge accumulation region 1006a.

The above-described respective MOS transistors Tr1 and Tr2 are constructed as follows. That is, a p type semiconductor well region 1009 is formed on the surface of the n type semiconductor substrate 1002 so as to become adjacent to the photodiode PD and heavily-doped n type semiconductor regions, that is, source/drain regions 1010 and 1014 are formed within this p type semiconductor well region 1009 by implanting ions.

The charge read transistor Tr1 is formed of an $n^+$ source/drain region 1010, the $n^+$ charge accumulation region 1006a of the photodiode PD and a gate electrode 1012 formed on the substrate surface between the two regions 1010 and 1006a through a gate insulating film 1011. This $n^+$ source/drain region 1010 becomes a so-called floating diffusion region (FD) and a channel region 1008 is formed right under the gate electrode 1012.

The transistor Tr2 such as a reset transistor, an amplifier transistor and a vertical selection transistor is similarly formed of a pair of $n^+$ source/drain regions 1014 and a gate electrode 1015 formed on the p type semiconductor well region 1009 between the $n^+$ source/drain regions 1014 and 1014 through a gate insulating film, although not shown partly.

Also, a pixel separation region 1019 formed of a p type semiconductor region is formed just under the p type semiconductor well region 1009 corresponding to the read circuit region 1019 on which the two transistors Tr1 and Tr2 of the semiconductor substrate 1002 are formed.

A circuit wiring 1016 of the above-mentioned respective MOS transistors Tr1 and Tr2 is formed of a multilayer wiring through an interlayer insulator 1017. A wiring 1017 is formed only within a read circuit region 1018 and this wiring 1017 is not formed on the photodiode PD because it blocks light introduced from the substrate surface side. Although not shown, a color filter and an on-chip microlens are formed on this multilayer wiring layer through a planarization film.

In this CMOS solid-state image pickup device 1001, light L is introduced from the surface side of the semiconductor substrate 1002 into the photodiode PD, signal electric charges (electrons in this example) e corresponding to an amount of light photo-electrically converted within the photodiode PD are accumulated in the $n^+$ charge accumulation region 1006a and the thus accumulated signal electric charges are read out through the read circuit formed of the respective MOS transistors Tr1 and Tr2.

On the other hand, the assignee of the present application has previously proposed a back-illuminated type CMOS solid-state image pickup device in which light is introduced from the back side of the substrate (see Cited Patent Reference 1). As shown in FIG. 2, a p type pixel separation region 1023 is formed on, for example, an n type silicon semiconductor substrate 1022 and photodiodes PD and a plurality of MOS transistors Tr1 and Tr2 are formed on respective pixel regions to thereby form a unit pixel 1025, a large number of pixels 1025 being arranged in a two-dimensional matrix fashion. The pixel separation region 1023 is formed of, for example, a p type semiconductor region from the surface of the substrate to the back surface of the substrate. The photodiode PD is composed of an n type semiconductor substrate 1022 encircled by the p type pixel separation region and a relatively deep p type semiconductor well region in which each MOS transistor is formed and heavily-doped p type semiconductor regions on the surface and back surface of the substrate, that is, $p^+$ type accumulation layers 1026 and 1027 for suppressing a so-called dark current. The n type semiconductor substrate 1022 of the photodiode PD is composed of a heavily-doped $n^+$ type charge accumulation region 1022a on the substrate surface side and an n type semiconductor region 1022b extended to the back surface side of the substrate and of which impurity concentration is lower than that of the $n^+$ charge accumulation region. The n type semiconductor region 1022b extended to the back surface side of this substrate is formed so as to be extended under a p type semiconductor well region 1024 corresponding to a so-called read circuit region in which each MOS transistor is formed.

A plurality of MOS transistors Tr1 and Tr2 can be formed of four MOS transistors of, for example, a charge read transistor, a reset transistor, an amplifier transistor and a vertical selection transistor similarly as described above. In FIG. 2, the charge read transistor is denoted by reference numeral Tr1 and other reset transistor, amplifier transistor and vertical selection transistor are denoted by reference numerals Tr2. The charge read transistor Tr1 is composed of an $n^+$ source/drain region 1029, an $n^+$ charge accumulation region 1022a of the photodiode PD and a gate electrode 1030 formed on the substrate surface between the two regions 1029 and 1022a through a gate insulating film. This $n^+$ source/drain region 1029 becomes a so-called floating diffusion (FD). A channel region 1034 is formed just under the gate electrode 1030.

The transistor Tr2 such as other reset transistor, amplifier transistor and vertical selection transistor is similarly composed of a pair of source/drain regions 1031 and 1032 and a gate electrode 1033 formed on a p type semiconductor well region 1024 between the source/drain regions 1031 and 1032 through a gate insulating film although not shown partly. Although not shown, a color filter and an on-chip microlens are formed on the back surface side of the substrate through an insulating film which serves as a planarization film as well.

In the back-illuminated type CMOS solid-state image pickup device 1021, light is introduced from the back side of the semiconductor substrate 1022 into the photodiode PD, signal electric charges corresponding to an amount of received light photo-electrically-converted in the photodiode PD are accumulated in the $n^+$ charge accumulation region 1022a and these signal electric charges are read out through the read circuit formed of the respective MOS transistors Tr1 and Tr2.

Also, in recent years, video cameras and electronic cameras are widely used and these cameras use CCD (charge-coupled device) type and amplification type solid-state image pickup devices. Of these solid-state image pickup devices, the amplification type solid-state image pickup device (CMOS image sensor) includes an image pickup pixel unit in which one semiconductor chip has a plurality of pixels arranged thereon in a two-dimensional fashion and a peripheral circuit unit disposed at the outside of the image pickup pixel unit.

Each pixel of the image pickup pixel unit has formed therein an FD (floating diffusion) unit and various kinds of CMOS transistors such as transfer transistors and amplification transistors. Light incident on each pixel is photo-electrically-converted by a photodiode to generate signal electric charges. The signal electric charges are transferred to the FD unit by the transfer transistor and fluctuation of potential at this FD unit is detected by the amplification transistor, the thus detected fluctuation of potential is converted into and amplified to an electric signal and a signal of every pixel is outputted from the signal line to the peripheral circuit unit.

Further, the peripheral circuit unit includes a signal processing circuit for effecting predetermined signal processing, such as CDS (correlation double sampling), gain control and A/D (analog-to-digital) conversion, on a pixel signal from the image pickup pixel unit and a drive control circuit for controlling an output of a pixel signal by driving each pixel of the image pickup pixel unit, such as vertical and horizontal scanners and a timing generator (TG).

In order to produce a small CMOS camera module, there is developed a method of connecting a CMOS solid-state image pickup device and a signal processing device as one chip. To improve sensitivity and shading characteristics, there is developed a so-called back-illuminated type CMOS image sensor having a structure to introduced light from the back surface of the opposite side of the surface in which a read circuit for reading a signal from a photo-electric conversion element is formed.

FIG. 3 is a schematic cross-sectional view showing an arrangement of an image sensor in which the above-described back-illuminated type CMOS solid-state image pickup device is mounted.

As shown in FIG. 3, a sensor chip 101 having an image pickup pixel unit and a signal processing chip 102 having a peripheral circuit unit such as a signal processing circuit are mounted on an interposer (intermediate substrate) 103, for example.

In the sensor chip 101, an interlayer insulator 60 is formed on a supporting substrate 70 and a wiring layer 61 is buried into the interlayer insulator 60. A semiconductor layer 52 is formed above the wiring layer 61 and a surface insulating layer 51 is formed on the surface of the semiconductor layer 52.

A photodiode 54 serving as a photo-electric conversion element and a test electrode 53 and the like are formed in the semiconductor layer 52. Also, a part of the wiring layer 61 serves as a gate electrode formed on the semiconductor layer 52 through a gate insulating film, thereby resulting in a CMOS transistor 55 being constructed.

Further, a semiconductor layer penetrating wiring 56 is formed so as to be connected to the wiring layer 61 through the semiconductor layer 52, a part of the surface insulating film 51 is removed near the portion in which the semiconductor layer penetrating wiring 56 is formed and a pad electrode 57 is formed so as to be connected to the semiconductor layer penetrating wiring 56.

The sensor chip 101 having the above-described arrangement is the so-called back-illuminated type CMOS solid-state image pickup device in which light is irradiated on the photodiode 54 formed in the semiconductor layer 52 from the side of the surface insulating film 51 to generate signal electric charges, the thus generated signal electric charges being accumulated in the photodiode 54. The CMOS transistor 55 has functions to transfer signal electric charges accumulated in the photodiode 54 to the FD unit, to amplify or reset the electric signal.

In the above-described arrangement, the semiconductor layer is obtained by decreasing the thickness of the back surface of the semiconductor substrate and has a structure in which the semiconductor substrate is bonded to the supporting substrate 70 in order to stabilize the shape of the substrate.

The above-described sensor chip 101 is mounted on the interposer 103 in which a wiring 80 and an insulating layer 81 for insulating the wiring 80 are formed on the surface from the side of the supporting substrate 70 of the opposite side of the light illuminated side by a suitable means such as an adhesive layer. The wiring 80 and the pad electrode 57 are electrically connected by wiring bonding 82a.

On the other hand, the signal processing chip 102 with the peripheral circuit unit formed thereon is mounted on the interposer 103 through bumps, for example, by flip-chip bonding.

The electronic device having the above arrangement is mounted on other mounted substrate at every interposer 103a nd these electronic devices are electronically connected by a suitable method such as the wire bonding 82b.

A method of manufacturing an image sensor in which the above-described related-art back-illuminated type CMOS solid-state image pickup device is mounted on the mounted substrate will be described.

As shown in FIG. 4A, the insulating film 51 made of silicon oxide and which will become a surface insulating film in the later process is formed on the surface of the semiconductor substrate 50 made of silicon and the like, and an SOI (semiconductor on insulator) substrate in which the semiconductor layer 52 made of silicon and the like is formed is formed on the upper layer of the insulating film 51, thereby resulting in the test electrode 53 being formed.

Next, as shown in FIG. 4B, the photodiode 54 is formed in the semiconductor layer 52 by implanting ions of conductive impurities. Further, the gate electrode is formed on the surface of the semiconductor layer 52 through the gate insulating film and the gate electrode is connected to the photodiode 54 and the like to thereby form the CMOS transistor 55. Further, there is formed the interlayer insulator 60 that covers the CMOS transistor. At that time, the wiring layer 61 is formed in the interlayer insulator 60 while it is buried into the interlayer insulator 60 so as to be connected to the transistor, the semiconductor layer 52 and the like.

Next, as shown in FIG. 4C, the supporting substrate 70 is bonded to the upper layer of the interlayer insulator 60.

Next, as shown in FIG. 4D, the semiconductor substrate 50 is removed by polishing the semiconductor substrate 50 from the surface of the opposite side of the side in which the supporting substrate 70 is bonded to the insulating film 51 until the insulating film 51 is exposed. The insulating film 51 exposed on the surface will be referred to as a "surface insulating film". In the following processes, the upper and lower relationship will be reversed relative to FIG. 4C for convenience sake of sheet of drawing.

Next, as shown in FIG. 4E, the penetrating wiring 56 which is connected through the semiconductor layer 52 to the wiring layer 61 is formed by removing a part of the surface insulating film 51 and the pad electrode 57 is formed so as to be connected to the penetrating wiring 56.

As described above, there is formed the related-art back-illuminated type CMOS solid-state image pickup device (sensor chip) 101.

The above-described back-illuminated type CMOS solid-state image pickup device (sensor chip) 101 is mounted on the interposer 103 from the side of the supporting substrate 70 of the opposite side of the light illuminated side by a suitable means such as the adhesive layer and connected by the wire bonding 82a.

On the other hand, the signal processing chip 102 in which the peripheral circuit unit is formed is mounted on the interposer 103 through the bumps by flip-chip bonding and the back-illuminated type CMOS solid-state image pickup device (sensor chip) 101 and the signal processing chip 102 are connected through the wiring formed on the interposer 103. In this manner, there can be manufactured the image sensor in which the above-described related-art back-illuminated type CMOS solid-state image pickup device is mounted on the interposer.

In the back-illuminated type CMOS solid-state image pickup device (image sensor) having the above-described arrangement, since the pad electrode has to be large enough to be connected by wiring bonding, the chip area is increased unavoidably. Also, since the number of electrodes that can be formed within the chip is limited and high-resistance wiring bonding is used, speed at which a signal is transmitted from the sensor chip to the signal processing device is lowered.

On the other hand, there is developed a back-illuminated type CMOS solid-state image pickup device having an arrangement in which an electrode is led out from the surface of the opposite side of the light illuminated surface. In this case, while the light illuminated surface is being directed in the upper direction, this back-illuminated type CMOS solid-state image pickup device is mounted on the mounted substrate from the side of the surface in which the electrode is formed of the opposite surface.

Cited Patent References 1 and 2 had described the back-illuminated type CMOS solid-state image pickup device in which the electrode is formed on the opposite surface of the light illuminated surface.

[Cited Patent Reference 1]: Official Gazette of Japanese laid-open patent application No. 2003-31785

[Cited Patent Reference 2]: Official Gazette of Japanese laid-open patent application No. 2003-273343

In recent years, in the solid-state image pickup device, it is desirable that pixels should be microminiaturized in order to integrate a large number of pixels at high integration degree so as to meet with needs of high resolution. As shown in FIG. 1, in the case of the above-mentioned surface-illuminated type CMOS solid-state image pickup device 1001, since the photodiode PD and a plurality of transistors Tr1 and Tr2 such as the electric charge read transistors are disposed on the same plane in each pixel region, there is a tendency that the area of one pixel 1005 is increased. For this reason, it becomes difficult to make the pixel size become very small. When the pixel size is made very small, since the area of the photodiode PD is reduced, problems arise, in which the saturation electric charge amount (Qs) is lowered and in which sensitivity is lowered.

On the other hand, as shown in FIG. 2, in the above-mentioned back-illuminated type CMOS solid-state image pickup device 1021, since the light L is introduced from the back surface side of the substrate into this CMOS solid-state image pickup device 1021, it is possible to increase the light-receiving area as compared with the surface-illuminated type CMOS solid-state image pickup device and hence sensitivity can be increased. However, as shown in FIG. 2, in this back-illuminated type CMOS solid-state image pickup device 1021, it is desirable that the electric charges e generated in the photo-electric conversion region portion 1022c corresponding to the lower portion (that is, lower portion of the p type semiconductor well region 1024) of the read circuit formed of a plurality of MOS transistors should be efficiently collected to the $n^+$ charge accumulation region 1022a on the surface side of the substrate, thereby suppressing the saturation electric charge amount (Qs) from being lowered.

SUMMARY OF THE INVENTION

In view of the aforesaid aspect, the present invention intends to provide a solid-state image pickup device in which the pixel size can be made very small without lowering a saturation electric charge amount (Qs) and sensitivity.

Further, the present invention intends to provide a camera including the above-mentioned solid-state image pickup device.

Furthermore, the present invention intends to provide a process of simply and easily manufacturing a back-illuminated type CMOS solid-state image pickup device having an arrangement in which an electrode is led out from the surface of the opposite side of the light illuminated surface.

According to an aspect of the present invention, there are provided a back-illuminated type solid-state image pickup device and a camera in which a read circuit for reading a signal from a photo-electric conversion element formed on a substrate is formed on one surface of said substrate, incident light being introduced into the back-illuminated type solid-state image pickup device from the other surface of the semiconductor substrate. The solid-state image pickup device and the camera are comprised of a photo-electric conversion region formed under at least a portion of the read circuit to generate electric charges and an electric charge accumulation region formed on the photo-electric conversion element at its one surface side of the substrate, wherein electric charges are collected to the electric charge accumulation region by an electric field formed within the photo-electric conversion element.

In the solid-state image pickup device and the camera according to the present invention, the photo-electric conversion region within the photo-electric conversion element and the electric charge accumulation region have therebetween formed a potential distribution such that potential is increased from the photo-electric conversion region to the electric charge accumulation region.

Further, in the solid-state image pickup device and the camera according to the present invention, the photo-electric conversion element has a potential distribution of which potential is increased from the other surface of the substrate to one surface along the depth direction of the substrate.

According to other aspect of the present invention, there are provided a method of manufacturing a back-illuminated type solid-state image pickup device and a camera in which a read circuit for reading a signal from a photo-electric conversion element formed on a substrate is formed on one surface of the substrate, incident light being introduced into the back-illuminated type solid-state image pickup device from the other surface of the semiconductor substrate. A method of manufacturing a solid-state image pickup device and a camera are comprised of the steps of forming a photo-electric conversion region under at least a portion of the read circuit to generate electric charges, forming an electric charge accumulation region on the photo-electric conversion element at its one surface side of the substrate and collecting electric charges to the electric charge accumulation region by an electric field formed within the photo-electric conversion element.

In the method of manufacturing a solid-state image pickup device and a camera according to the present invention, the photo-electric conversion element has a potential distribution of which potential is increased from the other surface of the substrate to one surface along the depth direction of the substrate.

Further, in the method of manufacturing a solid-state image pickup device and a camera according to the present invention, the photo-electric conversion element on the other side of the semiconductor substrate of a semiconductor well region of the photo-electric conversion element has a potential distribution of which potential is increased from the other surface of the semiconductor substrate to one surface of the semiconductor substrate.

According to a further aspect of the present invention, there are provided a method of manufacturing a solid-state image pickup device including a semiconductor well region and a camera. In this method of manufacturing a solid-state image pickup device and a camera according to the present invention, the semiconductor well region has a portion contacting with the photo-electric conversion element, the portion having an impurity concentration which is decreased progressively or stepwise from other surface of the semiconductor substrate to one surface of the semiconductor substrate.

According to a further aspect of the present invention, there are provided a method of manufacturing a solid-state image pickup device including a pixel separating region to separate the photo-electric conversion element. In this method of manufacturing a solid-state image pickup device according to the present invention, the pixel separating region has an impurity concentration which is decreased progressively or stepwise from the other surface of the semiconductor substrate to one surface of the semiconductor substrate.

In the method of manufacturing a solid-state image pickup device according to the present invention, the photo-electric conversion portion and the electric charge accumulation region within the photo-electric conversion element have formed therebetween a potential distribution which is increased from the photo-electric conversion portion to the electric charge accumulation region.

Further, in the method of manufacturing a solid-state image pickup device according to the present invention, the photo-electric conversion element has a potential distribution of which potential is increased from the other surface of the substrate to one surface in the substrate depth direction.

In accordance with yet a further aspect of the present invention, there are provided a method of manufacturing a back-illuminated type solid-state image pickup device and a camera in which a buried wiring connected to a plurality of pixels is formed on one surface of a semiconductor layer in which a plurality of pixels containing a photo-electric conversion element and a field-effect transistor is formed, the other surface of the semiconductor layer serving as a light-receiving portion of the photo-electric conversion element. A method of manufacturing a solid-state image pickup device and a camera are comprised of the steps of a step of forming a plurality of pixels containing the photo-electric conversion element and the field-effect transistor on one principal plane of a semiconductor substrate, a step of forming buried wirings, connected to a plurality of pixels, on one principal plane of the semiconductor substrate, a step of bonding a supporting substrate to one principal plane of the semiconductor substrate, a step of decreasing a thickness of the supporting substrate from the opposite side of a bonding surface, a step of forming penetrating wirings, which pass through the supporting substrate, such that the penetrating wirings are connected to the buried wirings and a step of decreasing a thickness of the semiconductor substrate from the other principal plane of the semiconductor substrate to provide the semiconductor layer until the photo-electric conversion element becomes able to receive light from the other principal plane of the semiconductor substrate.

The above-described method of manufacturing a solid-state image pickup device and a camera according to the present invention is a method of manufacturing a back-illuminated type solid-state image pickup device in which buried wirings connected to a plurality of pixels are formed on one plane of a semiconductor layer in which a plurality of pixels including a photo-electric conversion element and a field-effect transistor is formed, the other plane of the semiconductor layer becoming a light-receiving surface of the photo-electric conversion element.

First, a plurality of pixels including the photo-electric conversion element and the field-effect transistor is formed on one principal plane of the semiconductor substrate and further the buried wirings connected to a plurality of pixels are formed.

Next, the supporting substrate is bonded to one principal plane of the semiconductor substrate, the supporting substrate is decreased in thickness from the opposite side of the surface in which the supporting substrate is bonded to one principal plane of the semiconductor substrate and the penetrating wirings, which pass through the supporting substrate, are formed so as to be connected to the buried wirings.

Next, the semiconductor substrate is decreased in thickness from the other principal plane side of the semiconductor substrate to provide the semiconductor layer until the photo-electric conversion element becomes able to receive light from the other principal plane side of the semiconductor substrate.

Further, a method of manufacturing a solid-state image pickup device according to the present invention is further comprised of the step of forming a projection electrode, projected from the surface of the supporting substrate, on the surface of the penetrating wirings after the penetrating wiring forming process.

Furthermore, a method of manufacturing a solid-state image pickup device according to the present invention, the semiconductor substrate is an SOI (semiconductor on insulator) substrate having a semiconductor layer formed on a principal substrate through an insulating layer, the principal substrate being removed in the process for decreasing the thickness of the semiconductor substrate from the other principal plane of the semiconductor substrate until the insulating layer is exposed.

According to still a further aspect of the present invention, there is provided a method of manufacturing a back-illuminated type solid-state image pickup device and a camera in which buried wirings connected to a plurality of pixels are formed on one plane of a semiconductor layer on which a plurality of pixels containing a photo-electric conversion element and a field-effect transistor is formed, the other plane of the semiconductor layer becoming a light-receiving surface of the photo-electric conversion element. This method of manufacturing a solid-state image pickup device and a camera is comprised of the steps of a step of forming a plurality of pixels containing the photo-electric conversion element and the field-effect transistor on one principal plane of a semiconductor substrate, a step of forming buried wirings, which are connected to a plurality of pixels, on one principal plane of the semiconductor substrate, a step of forming a supporting substrate wiring which reaches from the surface of one principal plane of a supporting substrate to at least a predetermined depth, a step of bonding the one principal plane of the semiconductor substrate to one principal plane of the supporting substrate, a step of decreasing a thickness of the semiconductor substrate from other principal plane of the semiconductor substrate to provide the semiconductor layer until the photo-electric conversion element becomes able to receive light from the other principal plane of the semiconductor substrate, a step of forming a connection wiring to connect the supporting substrate wiring and the buried wiring and a step of decreasing a thickness of the supporting substrate from the other surface side of the supporting substrate until the supporting substrate wiring is exposed so that the supporting substrate wiring is formed as a, penetrating wiring which penetrates the supporting substrate.

The above-described method of manufacturing a solid-state image pickup device and a camera according to the present invention is a method of manufacturing a back-illuminated type solid-state image pickup device in which buried wirings connected to a plurality of pixels are formed on one plane of a semiconductor layer in which a plurality of pixels including a photo-electric conversion element and a field-effect transistor is formed, the other plane of the semiconductor layer becoming a light-receiving surface of the photo-electric conversion element.

First, a plurality of pixels including the photo-electric conversion element and the field-effect transistor is formed on one principal plane of the semiconductor substrate and further the buried wirings connected to a plurality of pixels are formed.

Next, the supporting substrate is bonded to one principal plane of the semiconductor substrate, the supporting substrate is decreased in thickness from the opposite side of the surface in which the supporting substrate is bonded to one principal plane of the semiconductor substrate and the penetrating wirings, which pass through the supporting substrate, are formed so as to be connected to the buried wirings.

Next, the semiconductor substrate is decreased in thickness from the other principal plane side of the semiconductor substrate to provide the semiconductor layer until the photo-electric conversion element becomes able to receive light from the other principal plane side of the semiconductor substrate.

Also, the present invention is a back-illuminated type solid-state image pickup device and a camera in which buried wirings connected to a plurality of pixels and penetrating wirings, which pass through the supporting substrate, connected to the buried wirings are formed on one plane of the semiconductor layer on which a plurality of pixels including a photo-electric conversion element and a field-effect transistor is formed, the other plane of the semiconductor layer becoming the light-receiving surface of the photo-electric conversion element.

Further, a method of manufacturing a solid-state image pickup device and a camera according to the present invention is further comprised of a step of forming a projection electrode, projected from the surface of the supporting substrate, on the surface of the penetrating wiring after the process of forming the supporting substrate wiring as the penetrating wiring.

Furthermore, a method of manufacturing a solid-state image pickup device and a camera according to the present invention, the semiconductor substrate is an SOI substrate in which a semiconductor layer is formed on a principal substrate through an insulating layer, the principal substrate being removed until the insulating film is exposed in the process of decreasing the thickness of the semiconductor substrate from other principal plane side of the semiconductor substrate.

According to the solid-state image pickup device and the camera of the present invention, the solid-state image pickup device and the camera are composed of the back-illuminated type solid-state image pickup device, wherein electric charges generated from the photo-electric conversion region portion formed under at least a part of the read circuit are collected to the electric charge accumulation region of the photo-electric conversion element by the electric field formed within the photo-electric conversion element, whereby a saturation electric charge amount can be increased. On the other hand, since the portion provided under the read circuit also is formed as the photo-electric conversion element, the incident light area in which light is introduced from the other surface of the substrate can be increased and hence sensitivity of the solid-state image pickup device and the camera can be improved. Accordingly, it becomes possible to make the pixel size become very small in accordance with increase of integration degree of pixel without lowering a saturation electric charge amount and sensitivity.

The potential distribution of which potential is increased from the photo-electric conversion region portion to the electric charge accumulation region is formed between the above-described photo-electric conversion region portion and electric charge accumulation region within the photo-electric conversion element, whereby electric charges can be moved from the photo-electric conversion region portion and accumulated in the electric charge accumulation region efficiently.

The potential distribution of which potential is increased toward the other plane of the substrate or one plane in the substrate depth direction of the photo-electric conversion element, whereby electric charges generated within the photo-electric conversion element can be efficiently moved to and accumulated in the electric charge accumulation region which exists on one plane.

Also, according to the method of manufacturing a solid-state image pickup device and a camera of the present invention, since the semiconductor substrate is decreased in thickness after the supporting substrate was bonded to the semiconductor substrate to maintain sufficient strength and the supporting substrate is decreased in thickness to form the penetrating wirings, it is possible to simply and easily manufacture the back-illuminated type CMOS solid-state image pickup device and the camera having the arrangement in which the electrode is led out from the surface of the opposite side of the light illuminated surface.

DESCRIPTION OF THE PREFERRED EMBODIMENTS

A first embodiment of the present invention will hereinafter be described with reference to the drawings.

Figure 1:
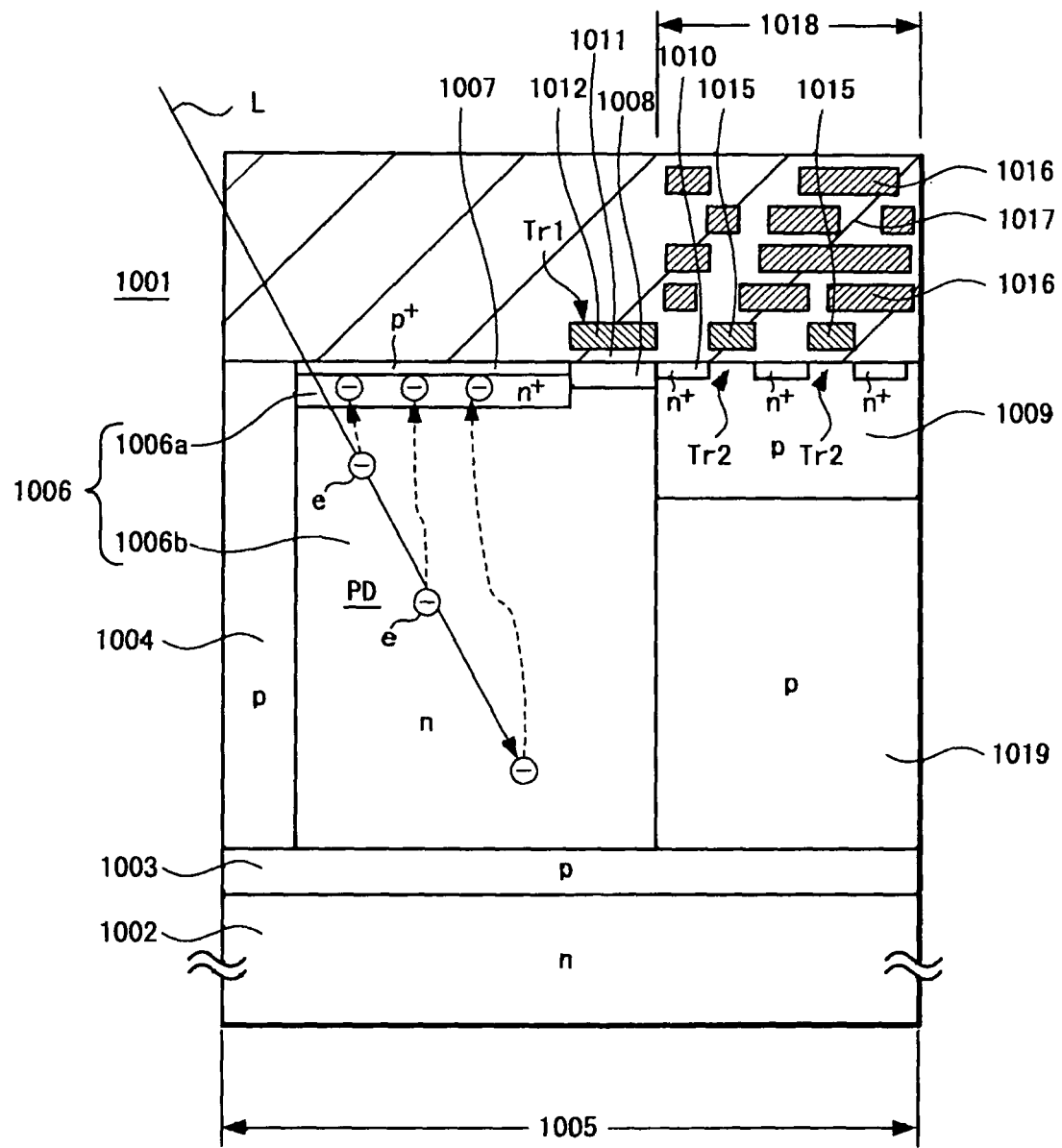
FIG. 1 is a schematic diagram showing an arrangement of a main portion of a surface-illuminated type CMOS solid-state image pickup device according to the related art.
Figure 2:
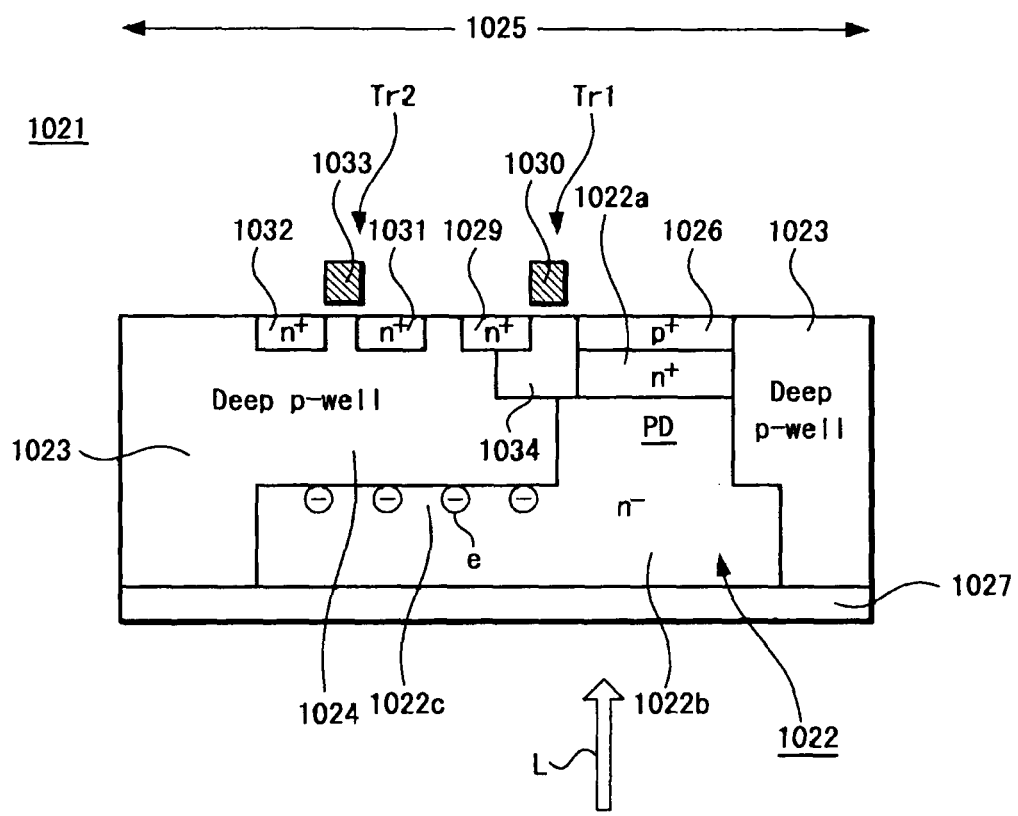
FIG. 2 is a schematic diagram showing an arrangement of a main portion of a back-illuminated type CMOS solid-state image pickup device according to the related art.
Figure 3:
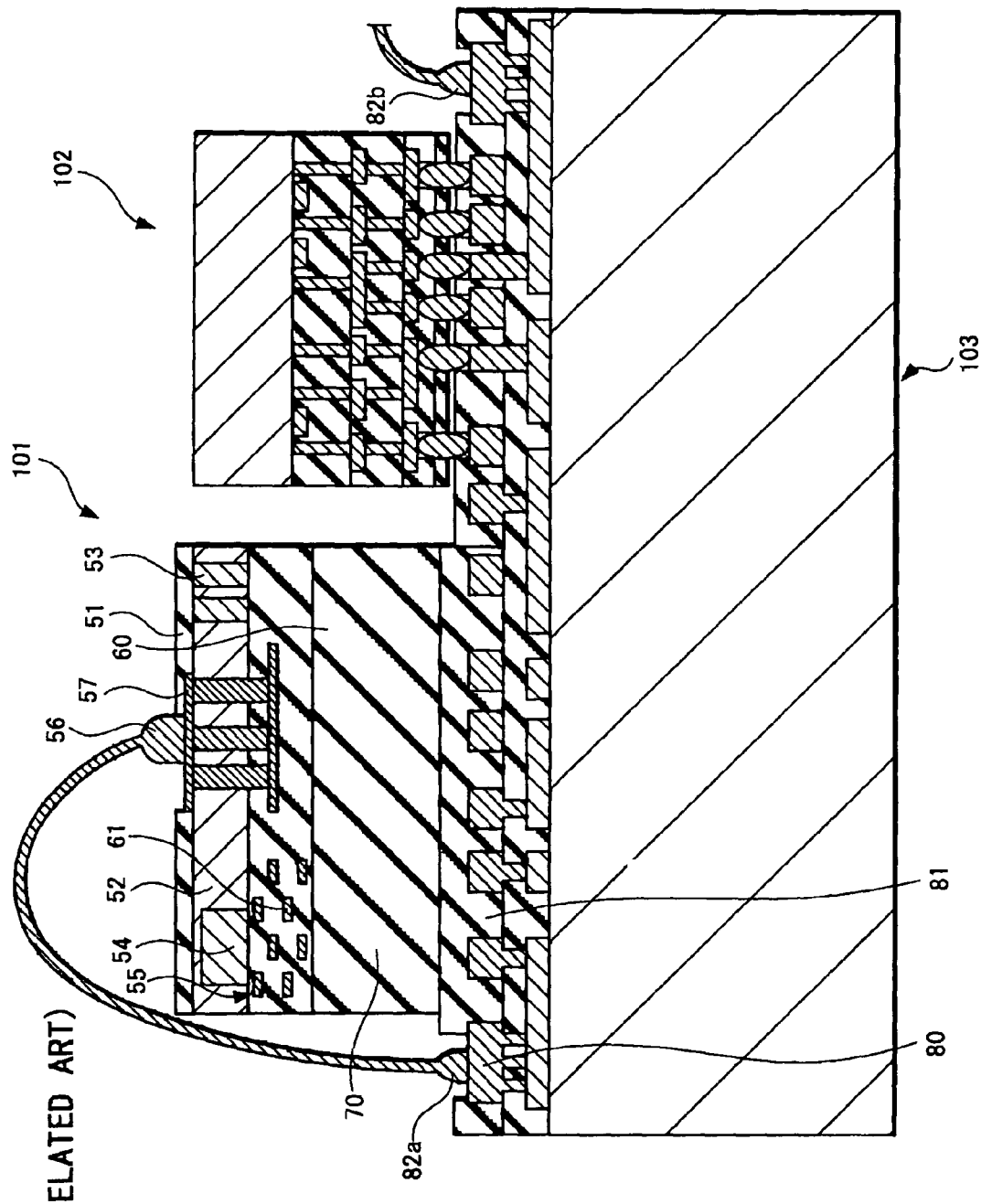
FIG. 3 is a schematic cross-sectional view showing an arrangement of an electronic device in which a back-illuminated type CMOS solid-state image pickup device according to an example of the related art.
Figure 4A:
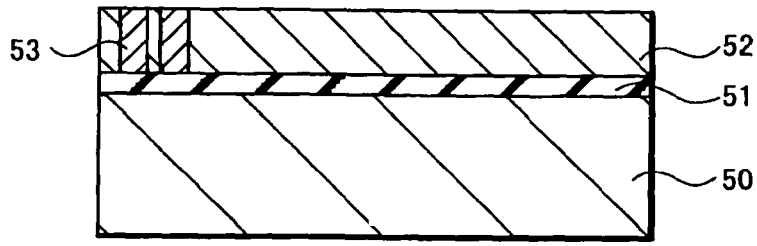
FIG. 4A to 4E are respectively cross-sectional views showing manufacturing processes of a back-illuminated type CMOS solid-state image pickup device according to an example of the related art.
Figure 4B:
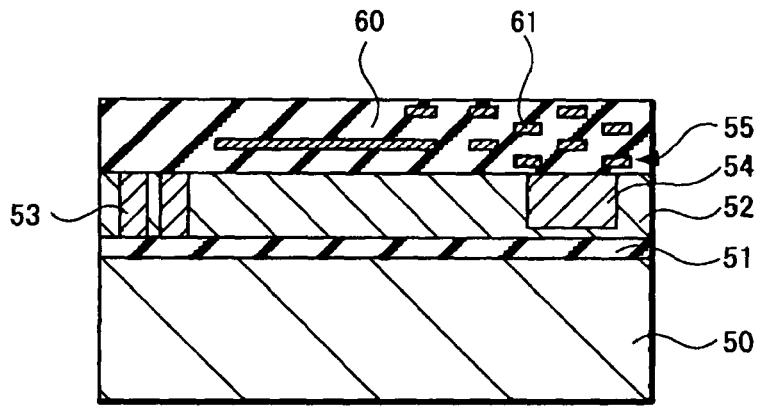
Figure 4C:
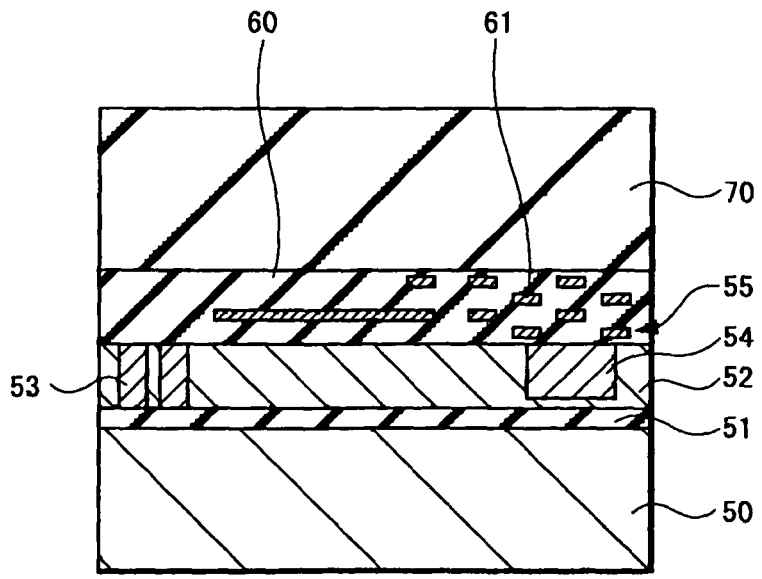
Figure 4D:
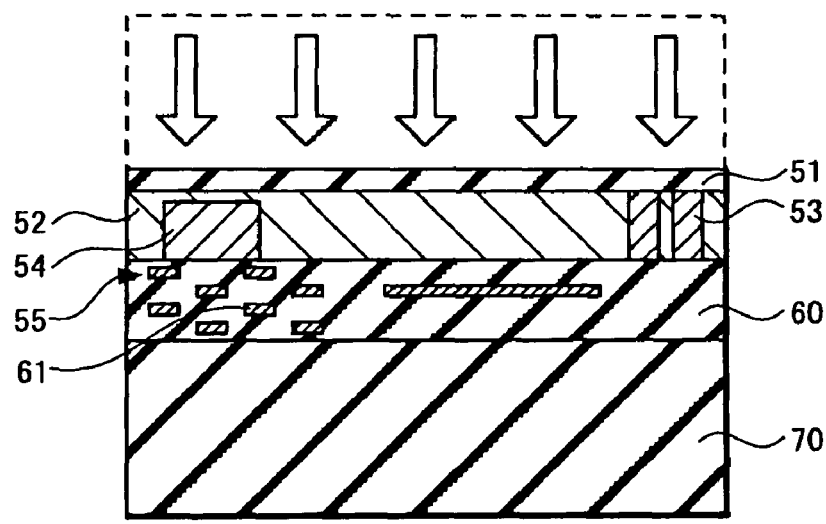
Figure 4E:
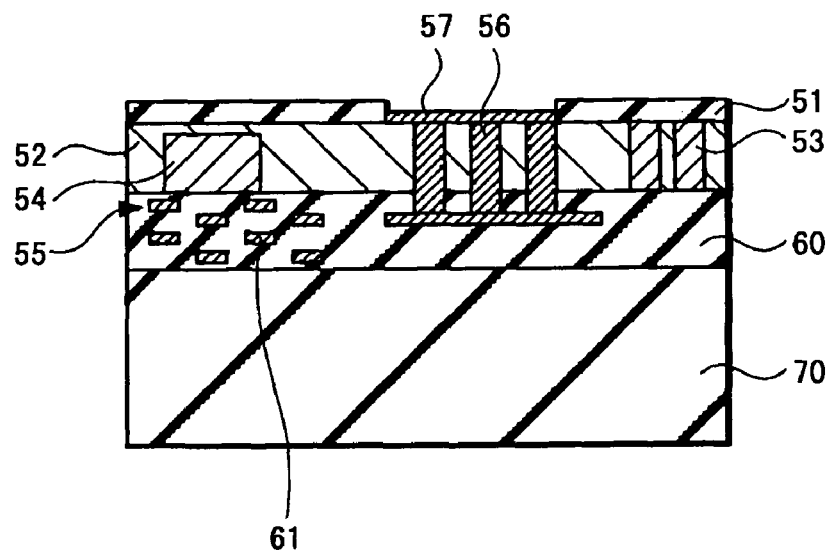
Figure 5:
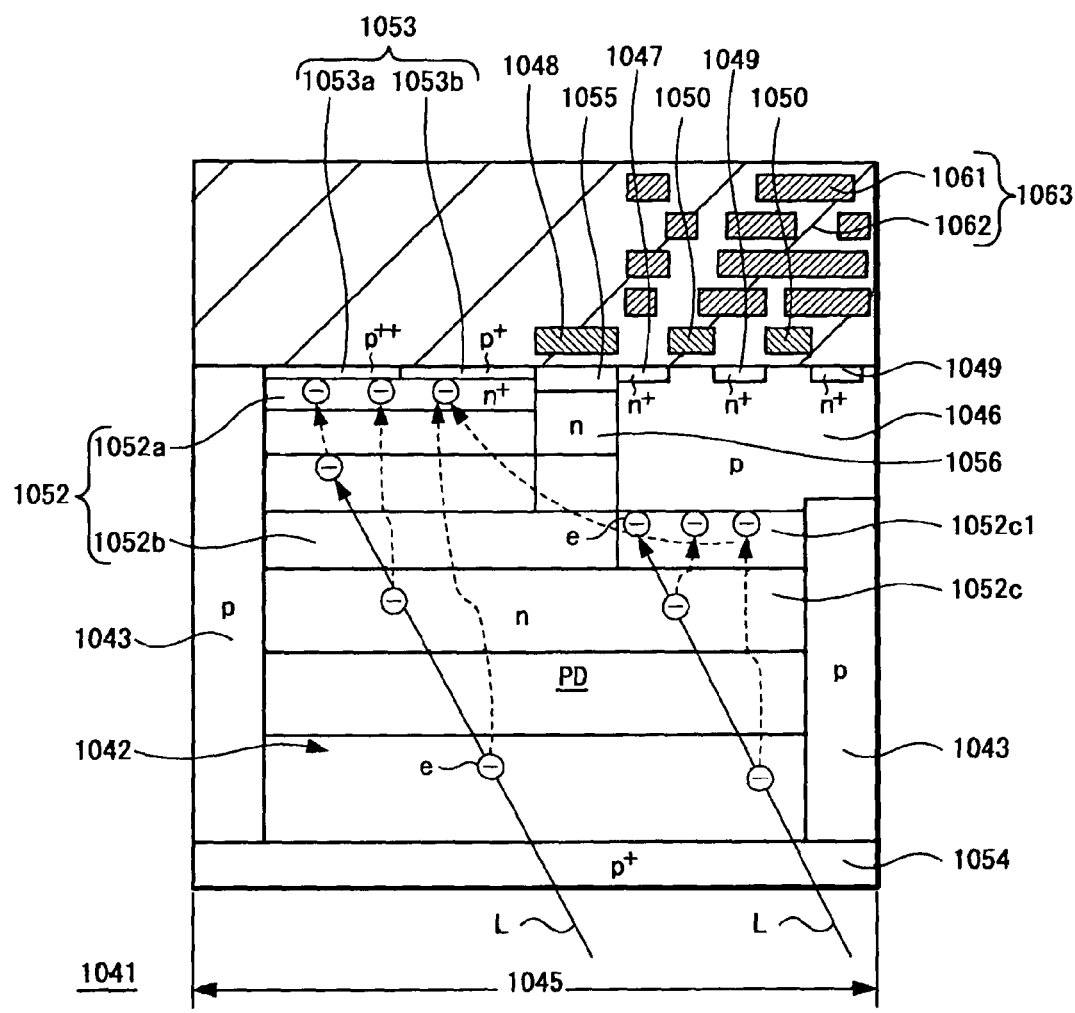
FIG. 5 is a schematic diagram showing an arrangement of a main portion of a solid-state image pickup device according to an embodiment of the present invention.

FIG. 5 is a schematic diagram showing an arrangement of a back-illuminated type CMOS solid-state image pickup device according to the present invention.

As shown in FIG. 5, a back-illuminated type CMOS solid-state image pickup device 1040 includes a first conductivity type, for example, an n type silicon semiconductor substrate 1042 on which a pixel separation region formed of a second conductivity type, for example, a p type semiconductor region to divide respective pixels is formed. On each divided area, there is formed a unit pixel 1045 composed of a photodiode PD and a plurality of MOS transistors, for example, four MOS transistors of an electric charge read transistor Tr1, a reset transistor, an amplifier transistor and a vertical selection transistor (all of which will be generally referred to a "Tr2"). A large number of unit pixels 1045 are arranged in an XY matrix fashion (that is, in a two-dimensional fashion).

A plurality of MOS transistors Tr1 and Tr2 constitutes a read circuit for reading signal electric charges from the photodiode PD. A plurality of MOS transistors constructing this read circuit is formed on a p type semiconductor well region 1046 formed in such a manner that a pixel separation region 1043 may be connected to one surface of the semiconductor substrate 1042, that is, the surface side of the substrate. The electric charge read transistor Tr1 is composed of a heavily-doped n$^+$ source/drain region 1047 formed within a p type semiconductor well region 1046, an n type electric charge accumulation region formed on the substrate surface of the photodiode PD and a gate electrode 1048 formed on the substrate surface between the two regions 1046 and 1047 through a gate insulating film. This n$^+$ source/drain region 1047 becomes a so-called floating diffusion (FD). The transistor Tr2 such as other reset transistor, amplifier transistor and vertical selection transistor is similarly formed of an n$^+$ source/drain region 1049 and a gate electrode 1050 formed on the p type semiconductor well region 1046 through the gate insulating film although not shown partly. A multilayer wiring layer 1063, which is provided by forming a circuit wiring 1061 of the read circuit, is formed on the semiconductor substrate on which the respective transistors are formed through an interlayer insulator 1062.

The photodiode PD is composed of an n$^+$ semiconductor region 1052 extended from one surface of the substrate to the other surface, that is, from the substrate surface through the back surface of the substrate to the underside of the p type semiconductor well region 1046 (that is, a read circuit region) in which the read circuit is formed, a heavily-doped p type semiconductor region formed on the interface of the surface side of the n type semiconductor region 1052, that is, so-called p$^+$ accumulation layer 1053 and a heavily-doped p type semiconductor region formed on the interface of the back surface side of the n type semiconductor region, that is, so-called p$^+$ accumulation layer 1054. The n type semiconductor region 1052 constructing the photodiode PD is composed of a heavily-doped n type electric charge accumulation region 1052a formed on the substrate surface side, an n type region 1052b having an impurity concentration higher than that of this electric charge accumulation region 1052a and which is extended from the electric charge accumulation region 1052a to the back surface side of the substrate and an type semiconductor region 1052c extended to the underside of the p type semiconductor well region 1046. A lower portion of the gate electrode 1048 of the electric charge read transistor also is formed as the n type semiconductor region 1052b.

Then, in this embodiment, in particular, in the n type semiconductor region 1052 constructing the photodiode PD, electric field to move photo-electrically-converted electric charges e toward the substrate surface side is formed in the substrate depth direction. Further, electric field is formed in order to move electric charges of the photo-electric conversion region formed right under the p type semiconductor well region 1046, that is, an n type semiconductor region 1052c1 to the n type electric charge accumulation region 1052a.

Specifically, a potential distribution of which potential is increased from the back surface of the substrate to the substrate surface is formed on the n type semiconductor region 1052. In this case, a potential distribution of which potential is increased from the back surface of the substrate to the n type electric charge accumulation region 1052a on the surface of the substrate is formed on the n type semiconductor region 1052b except the underside of the p type semiconductor well region 1046. A potential distribution of which potential is increased from the back surface of the substrate to the region 1052c1 on the surface side formed right under the p type semiconductor well region 1046 is formed on the n type semiconductor region 1052c under the p type semiconductor well region 1046.

Further, there is formed a potential distribution of which potential is increased from the nearby region including the n type semiconductor region 1052c1 right under the p type semiconductor well region 1046 to the n type electric charge accumulation region 1052a in substantially the lateral direction.

As an example of methods of forming the above-mentioned potential distribution, potential distributions can be formed by controlling the impurity concentration of the n type semiconductor region 1052. With respect to the substrate depth direction, the above-described potential distributions can be formed by progressively or stepwise, in this embodiment, stepwise increasing the n type impurity concentration of the n type semiconductor region 1052 from the back surface side of the substrate to the substrate surface side. With respect to substantially the lateral direction from the nearby region including the n type semiconductor region 1052c1 formed right under the p type semiconductor well region 1046 to the n type electric charge accumulation region 1052a, the above-described potential distributions can be formed by progressively or stepwise, in this embodiment, stepwise increasing the n type impurity concentration from the n type semiconductor region 1052c1 formed right under the p type semiconductor well region to the n type electric charge accumulation region 1052a.

The n type electric charge accumulation region 1052a, for example, can be formed by an impurity concentration that is higher than $10^{12}$ cm$^{-2}$, and the n type semiconductor region 1052c1 can be formed by an impurity concentration having a range of from about $10^{11}$ to $10^{12}$ cm$^{-2}$.

As another example of methods of forming the above-described potential distributions, the above-described potential distribution of the substrate depth direction can be formed by progressively or stepwise decreasing the p type impurity concentration of the p type pixel separation region 1043 from the back surface side of the substrate to the substrate surface side under the condition in which n type impurity concentrations of other n type semiconductor regions 1052b and 1052c than the n type electric charge accumulation region 1052a. Also, the above-described potential distribution of substantially the lateral direction can be formed by progressively or stepwise decreasing the p type impurity concentration of the portion adjoining the n type semiconductor region 1052c1 of the p type semiconductor well region 1046 toward the n type electric charge accumulation region 1052a under the condition in which the n type impurity concentrations of the n type semiconductor regions 1052b and 1052c are made constant similarly.

As illustrated, the region under the gate electrode 1048 of the electric charge read transistor Tr1 also is constructed as the n type semiconductor region 1052b of the photodiode PD. However, a channel region 1055 by which a predetermined threshold value can be obtained is formed right under the gate electrode 1048. During the light-receiving and accumulation period, the electric charges e in the n type semiconductor region 1052 just below the p type semiconductor well region 1046 also are moved to and accumulated in the n type electric charge accumulation region 1052a. At that case, in order to prevent the electric charges e from being leaked through the n type region portion 1056 just below the gate electrode 1048 into the source/drain region 1047 which becomes the floating diffusion (FD) of the electric charge read transistor Tr1, an impurity concentration in the n type region portion 1056 right under the gate electrode 1048 is set to be such one that a potential barrier may be formed.

Also, in the n type electric charge accumulation region 1052a, in order to efficiently transfer accumulated signal electric charges e to the electric charge read transistor Tr1, there is formed a potential distribution of which potential is increased toward the side of the electric charge read transistor Tr1. To this end, the impurity concentration of the n type electric charge accumulation region 1052a is made constant and the impurity concentration of the p$^+$ accumulation layer 1053 is decreased toward the electric charge read transistor Tr1. In this embodiment, an accumulation layer 1053 is formed between the two regions of a high concentration region 1053a and a low concentration region 1053b.

Although not shown, a color filter and an on-chip microlens are formed on the back surface side of the substrate through an insulating film. Also, a supporting substrate formed of a silicon substrate, for example, for reinforcement can be constructed on the multilayer wiring layer 1063. In this manner, there can be constructed a target back-illuminated type CMOS solid-state image pickup device 1041.

Next, operations of the above-mentioned back-illuminated type CMOS solid-state image pickup device 1041 according to this embodiment will be described. Incident light L is introduced from the back surface side of the substrate into the photodiode PD which is the photo-electric conversion element. The incident light L is introduced into the whole region of the photodiode PD including the lower portion of the p type semiconductor well region 1046 and it is photo-electrically-converted by the n type semiconductor region 1052 in the photodiode PD to thereby generate signal electric charges (electrons in this embodiment) e. The thus generated signal electric charges e are moved to a pn junction portion of the substrate surface side by the electric field formed within the n type semiconductor region 1052, that is, a potential distribution of which potential is increased toward the n type electric charge accumulation region 1052a. Specifically, the signal electric charges generated within the n type semiconductor region 1052*b* are moved to the pn junction portion of the substrate surface side by the above-described electric field and accumulated in the n type electric charge accumulation region 1052*a*. Also, signal electric charges generated in the n type semiconductor region 1052*c* under the p type semiconductor well region 1046 are moved to the pn junction formed on the lower portion of the p type semiconductor well region 1046, accordingly, the n type semiconductor region 1052*c*1 by the above-described electric field. Further, these signal electric charges are efficiently moved to the pn junction portion formed on the substrate surface side and accumulated in the n type electric charge accumulation region by the electric field formed toward the n type electric charge accumulation region 1052*a*, that is, the potential distribution of which potential is increased from the n type semiconductor region 1052*c*1 to the n type electric charge accumulation region 1052*a*.

According to the back-illuminated type CMOS solid-state image pickup device 1041 of this embodiment, since the lower portion of the p type semiconductor well region 104According to the back-illuminated type CMOS solid-state image pickup device 1041 of this embodiment, since the lower portion of the p type semiconductor well region 1046 forming the read circuit also is formed as the photodiode PD, the area in which incident light can be introduced from the back surface side can be made larger than that of the related-art surface-illuminated type CMOS solid-state image pickup device so that much more signal electric charges can be read out, thereby resulting in sensitivity being increased. Also, since the electric field is formed from the n type semiconductor region 1052*c*1 under the p type semiconductor well region 1046 to the n type electric charge accumulation region 1052*a*, signal electric charges in the n type semiconductor region 1052*c*1 can be efficiently accumulated in the n type electric charge accumulation region 1052*a* and hence much more signal electric charges can be accumulated. As a consequence, it is also possible to increase the saturation electric charge amount (Qs).

Figure 6:
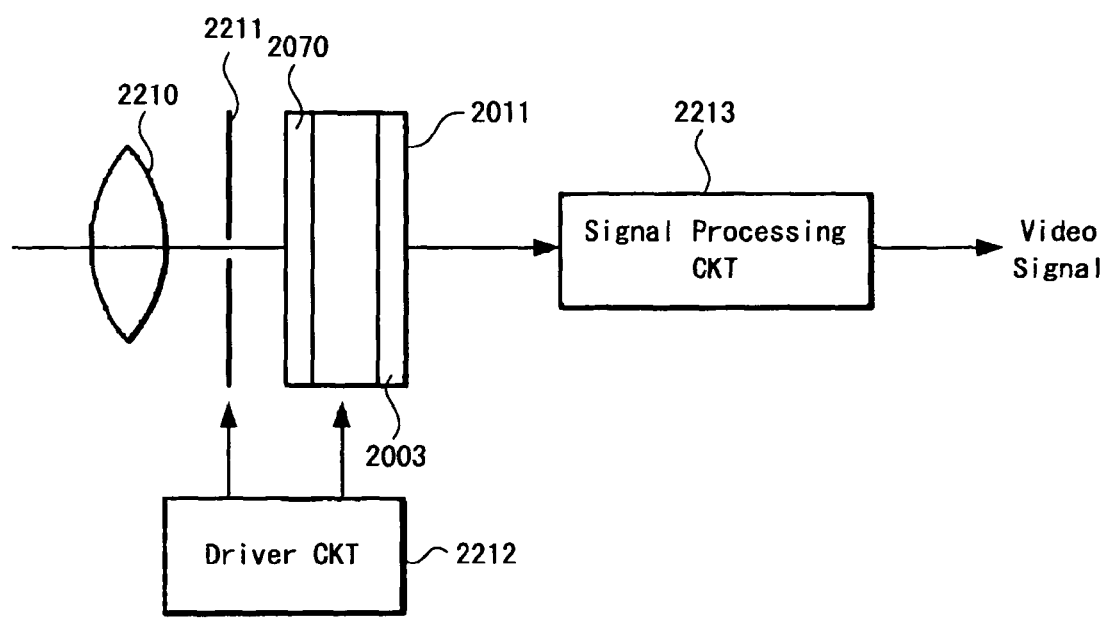
FIG. 6 is a schematic cross-sectional view showing a camera according to an embodiment of the present invention.

FIG. 6 is a cross-sectional view showing a camera according to the embodiment of the present invention. The camera according to this embodiment is a video camera which is able to shoot real moving pictures.

As shown in FIG. 6, the camera according to this embodiment includes a semiconductor image sensor/module 2011, an optical system 2210, a shutter apparatus 2211, a driver circuit 2212 and a signal processing circuit 2213.

The optical system 2210 is able to focus light of image (incident light) from the object on the image pickup screen of the semiconductor image sensor module 2011, whereby signal electric charges are accumulated within the semiconductor image sensor module 2011 during a constant period.

The shutter apparatus 2211 are able to control a time period in which light is illuminated on the semiconductor image sensor module 2011 and a time period in which the semiconductor image sensor module 2011 is shielded from illumination of light.

The driver circuit 2212 supplies drive signals to control transfer operations of the semiconductor image sensor module 2011 and also supplies drive signals to control shutter operations of the shutter apparatus 2211. The semiconductor image sensor module 2011 is able to transfer charges in response to drive signals (timing signals) supplied from the driver circuit 2212. The signal processing circuit 2213 carries out various kinds of signal processing. A video signal, which was processed in a suitable signal processing fashion, may be stored in a suitable recording medium such as a memory or it may be outputted to a monitor.

Therefore, according to this embodiment, even when the pixel size is reduced in accordance with the increase of integration degree of pixel, it is possible to provide a CMOS solid-state image pickup device with high sensitivity and large dynamic range.

A method of manufacturing a CMOS solid-state image pickup device according to the embodiment of the present invention will be described below with reference to the drawings.

A second embodiment of the present invention will be described.

Figure 7:
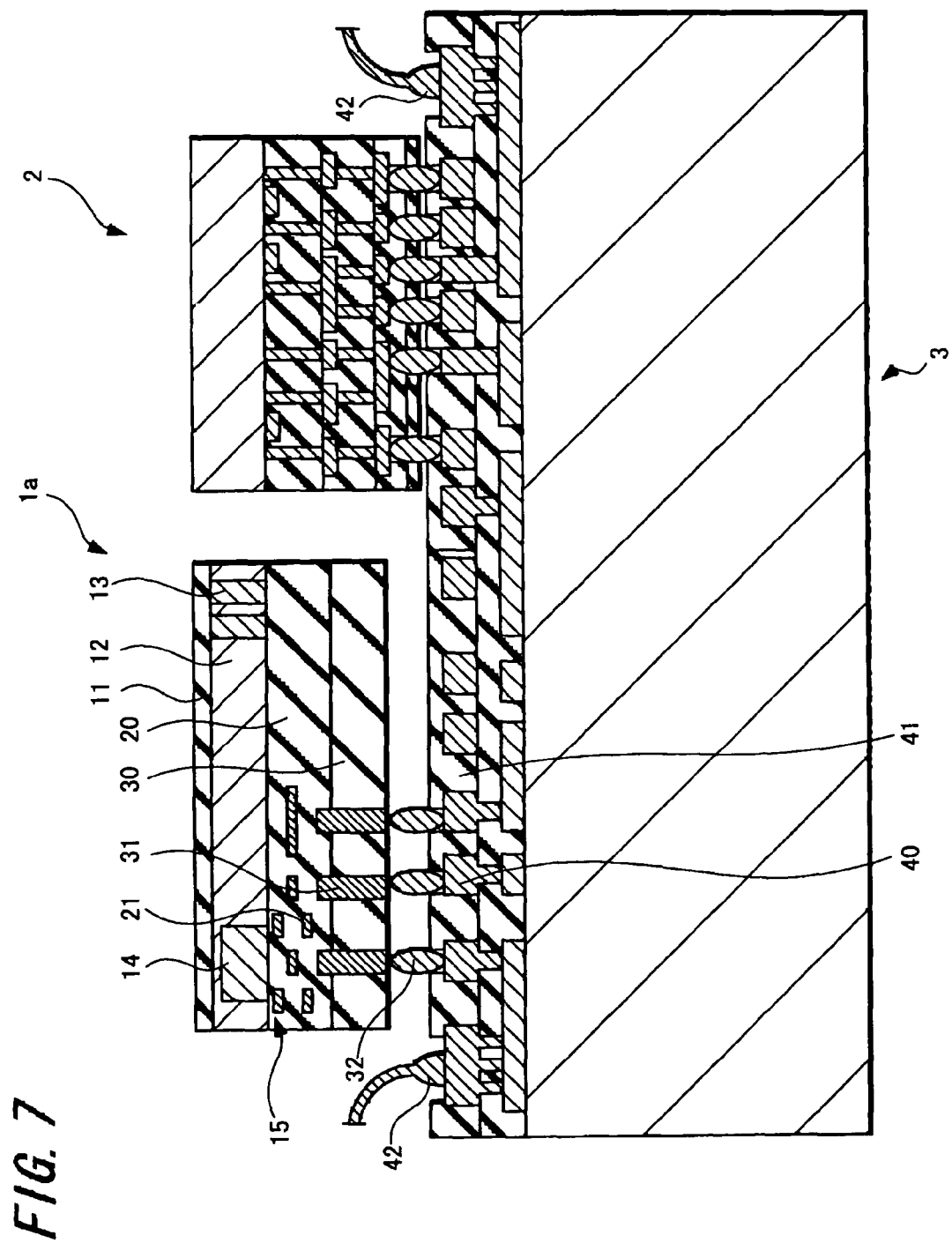
FIG. 7 is a schematic cross-sectional view showing an arrangement of an electronic device in which a back-illuminated type CMOS solid-state image pickup device according to a first embodiment of the present invention is mounted.

FIG. 7 is a schematic cross-sectional view showing an arrangement of an electronic apparatus in which the back-illuminated type CMOS solid-state image pickup device according to the first embodiment of the present invention is mounted.

As shown in FIG. 7, a sensor chip 1*a*, which is a back-illuminated type CMOS solid-state image pickup device with an image pickup pixel unit provided thereon, and a signal processing chip 2 with a peripheral circuit unit such as a signal processing circuit provided thereon, are mounted on an interposer (intermediate substrate) 3, for example.

The sensor chip 1*a* has an interlayer insulator 20 formed on a supporting substrate 30 and a buried wiring layer 21 buried therein. A semiconductor layer 12 is formed on the buried wiring layer 21 and a surface insulating layer 11 is formed on the surface of the semiconductor layer 12.

A photodiode 14 and an alignment mark 13 and the like are formed in the semiconductor layer 12. The alignment mark 13 is a mark for an occasion when patterning is carried out on the rear side of the semiconductor substrate 50. Also, a part of the buried wiring layer 21 becomes a gate electrode formed on the semiconductor layer 12 through a gate insulating film, thereby resulting in a CMOS transistor 15 being constructed.

Further, there is formed a supporting substrate penetrating wiring 31 which is connected to the wiring layer 21 through the supporting substrate 30. A protruded electrode (bump) 32, which is protruded from the surface of the supporting substrate 30, is formed on the supporting substrate penetrating wiring 31. The bump (micro-bump) 32 is a protrusion-like metal electrode formed on a pad smaller than an ordinary pad electrode for use with wiring bonding by a suitable method such as electrolytic plating.

The sensor chip 1*a* having the above-described arrangement is the so-called back-illuminated type CMOS solid-state image pickup device in which when light is illuminated on the photodiode 14 formed in the semiconductor layer 12 from the side of the surface insulating layer 11, signal electric charges are generated and accumulated in the photodiode 14. A CMOS transistor 15 has functions to transfer signal electric charges accumulated in the photodiode to the FD unit, to amplify signals or reset signals.

In the above-described arrangement, the semiconductor layer is obtained by decreasing the thickness of the back surface of the semiconductor substrate and it has the structure in which it is bonded to the supporting substrate 30 in order to stabilize the shape of the substrate.

As described above, the CMOS solid-state image pickup device according to this embodiment is the back-illuminated type solid-state image pickup device in which buried wirings connected to a plurality of pixels are formed on one surface of the semiconductor layer in which a plurality of pixels including the photo-electric conversion element and the field-effect transistor is formed, the other surface of the semiconductor layer becoming the light-receiving surface of the photo-electric conversion element.

The above-described sensor chip 1a is mounted on the interposer 3 in which wirings 40 and an insulating layer 41 for insulating the wirings 40 are formed from the side of the supporting substrate 30 of the opposite side of the light illuminated side by flip-chip bonding in such a manner that a land, which is provided by exposing a part of the surface of the wiring from the opening portion of the insulating layer, and the bump may be joined.

On the other hand, the signal processing chip 2 with the peripheral circuit unit formed thereon is mounted on the interposer through the bump, for example, by flip-chip bonding.

The electronic apparatus having the above-mentioned arrangement is mounted on other mounted substrate at every interposer and the electronic apparatus are electrically connected by wire bonding 42, for example, when they are in use.

A function evaluation electrode PAD in which the above-described sensor chip (CMOS solid-state image pickup device) and the signal processing chip are connected as one chip is formed on the interposer, for example.

Figure 8:
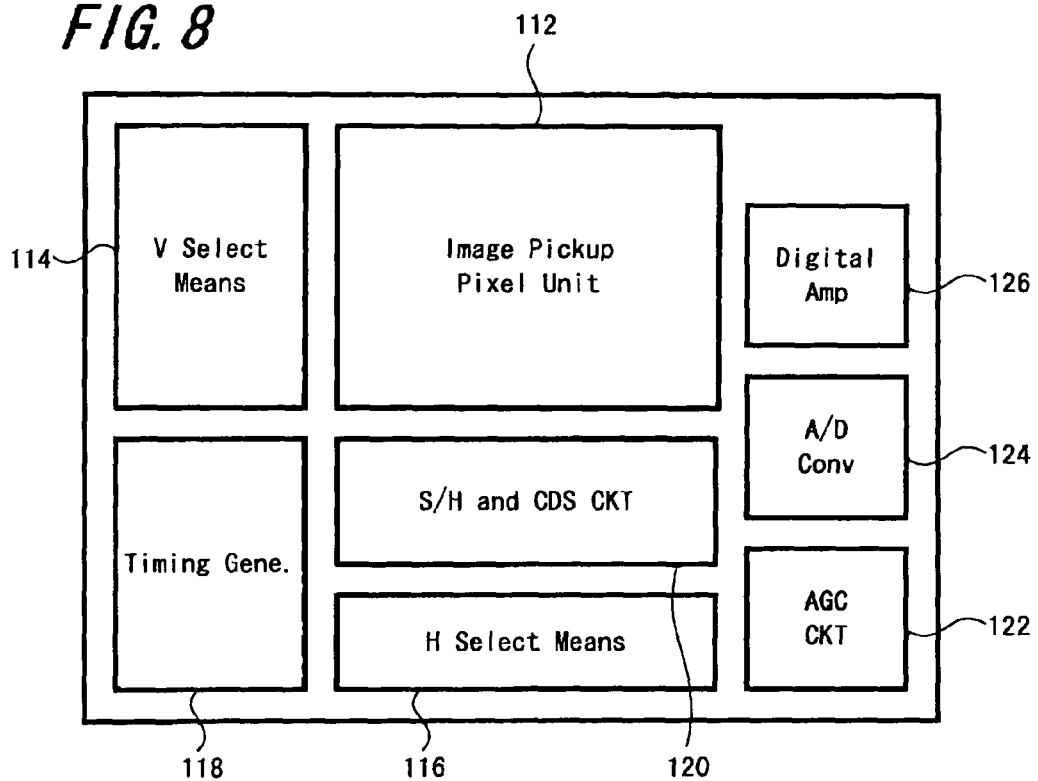
FIG. 8 is a block diagram showing an arrangement of an image sensor in which the back-illuminated type CMOS solid-state image pickup device according to the first embodiment of the present invention is assembled.
Figure 9:
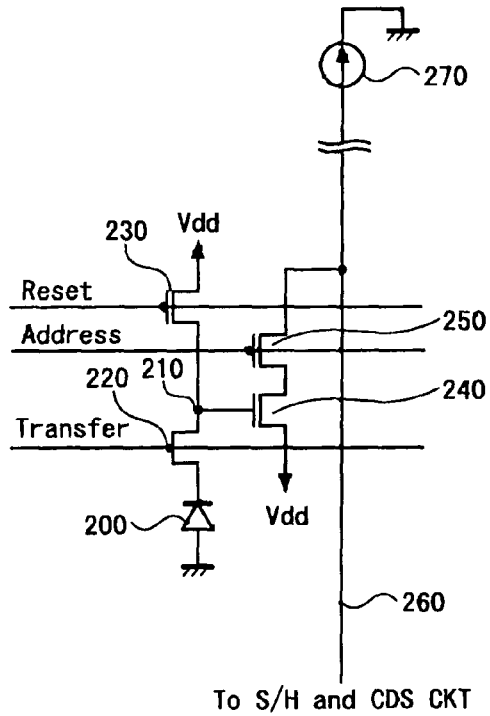
FIG. 9 is an equivalent circuit diagram showing an arrangement of a pixel of the back-illuminated type CMOS solid-state image pickup device according to the first embodiment of the present invention.

FIG. 8 is a block diagram showing an arrangement of an image sensor having the CMOS solid-state image pickup device according to this embodiment assembled therein, and FIG. 9 is an equivalent circuit diagram showing an arrangement of a pixel of the CMOS solid-state image pickup device according to this embodiment.

As shown in FIG. 8, the image sensor according to this embodiment is composed of an image pickup pixel unit 112, a V selection means 114, an H selection means 116, a timing generator (TG) 118, an S/H/CDS (sample-and-hold/correlation double sampling) circuit 120, an AGC (automatic gain control) unit 122, an A/D (analog-to-digital) conversion unit 124, a digital amplifying unit 126 and the like.

For example, the image pickup pixel unit 112, the V selection means 114, the H selection means 116 and the S/H/CDS circuit 120 can be integrated on one chip as the sensor chip 1a in FIG. 7 and the remaining circuit units can be integrate on the signal processing chip 2. Alternatively, only the image pickup pixel unit 112 can be formed on the sensor chip 1a.

The image pickup pixel unit 112 has a large number of pixels arranged in a two-dimensional fashion. As shown in FIG. 9, each pixel includes a photodiode (PD)200 which is a photo-electric conversion element for generating and accumulating signal electric charges corresponding to an amount of received light. Each pixel further includes four MOS transistors of a transfer transistor 220 for transferring signal electric charges photo-electrically-converted and accumulated by this photodiode 200 to a floating diffusion unit (FD unit) 210, a reset transistor 230 for resetting a voltage of the FD unit 210, an amplifier transistor 240 for outputting an output signal corresponding to the voltage of the FD unit 210 and a selection (address) transistor 250 for outputting an output signal of this amplifier transistor 240 to a vertical signal line 260.

In the pixel having the above-described arrangement, signal electric charges photo-electrically-converted by the photodiode 200 are transferred to the FD unit 210 by the transfer transistor 220. Since the FD unit 210 is connected to the gate of the amplifier transistor 240 and the amplifier transistor 240 constitute a source-follower transistor together with a constant current source 270 provided at the outside of the image pickup pixel unit 112, when the address transistor 250 is energized, a voltage corresponding to the voltage of the FD unit 210 is outputted to the vertical signal line 260. Also, the reset transistor 230 resets the voltage of the FD unit 210 to a constant voltage (drive voltage Vdd in FIG. 9) which does not depend on the signal electric charges.

Also, various kinds of drive wirings for driving and controlling respective MOS transistors are connected to the image pixel unit 112 in the horizontal direction. Respective pixels of the image pickup pixel portion 112 are sequentially selected at the horizontal line (pixel line) unit in the vertical direction by the V selection means 114 and the MOS transistors of respective pixels are controlled by various kinds of pulse signals from the timing generator 118, whereby signals of respective pixels are read out to the S/D/CDS unit 120 at every pixel column through the vertical signal line 260.

The S/H/CDS unit 120 (shown in FIG. 8) is such one in which a S/H/CDS circuit is provided at every pixel column of the image pickup pixel unit 113 and it effects signal processing such as CDS (correlation double sampling) on the pixel signal read out from every each pixel column of the image pickup pixel unit 112.

The H selection means 116 outputs the pixel signal from the S/H/CDS unit 120 to the AGC unit 122.

The AGC unit 122 effects predetermined gain control on the pixel signal from the S/H/CDS unit 120 selected by the H selection means 116 and outputs the corresponding pixel signal to the A/D conversion unit 124.

The A/D conversion unit 124 converts the pixel signal from the AGC unit 122 in the form of analog to digital signal and outputs the digital signal to the digital amplifier unit 126.

The digital amplifier unit 126 effects necessary amplification and buffering on the digital signal output from the A/D conversion unit 124 and outputs the thus processed digital signal from an external output (not shown).

The timing generator 118 supplies various kinds of timing signals to respective units other than each pixel of the above-mentioned image pickup pixel unit 112.

The CMOS image sensor having the above-described arrangement becomes able to directly input the signal outputted from the pixel of the CMOS image sensor to the signal processing device through the micro-bump at the pixel unit or at the unit of a plurality of pixels without inputting the output signal from the pad electrode formed at the circumference of the chip to the signal processing device after the signal outputted from the pixel was outputted to the pixel peripheral circuit unlike the related art. As a consequence, it becomes possible to provide a high performance and highly-capable device in which signal processing speed among devices is high and in which the image sensor and the signal processing device are integrated as one chip.

A method of manufacturing a back-illuminated type CMOS solid-state image pickup device according to this embodiment will be described.

Figure 10A:
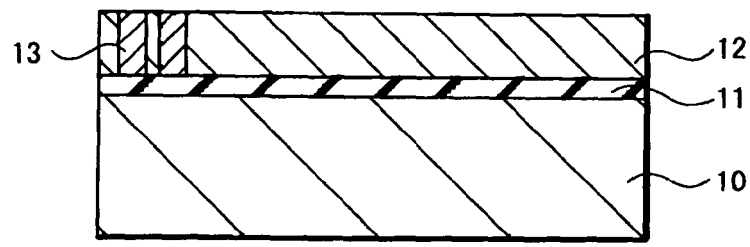
FIG. 10A to 10G are cross-sectional views showing manufacturing processes of the back-illuminated type CMOS solid-state image pickup device according to the first embodiment of the present invention, respectively.

First, as shown in FIG. 10A, an insulating film 11 made of silicon oxide and which will become a surface insulating film in the later process is deposited on the surface of the semiconductor substrate 10 made of silicon and the like, for example, by a suitable method such as a thermal oxidation method or a CVD (chemical vapor deposition) method.

Further, the semiconductor layer 12 formed of a suitable material such as silicon is deposited on the upper layer of the insulating layer 11, for example, by a suitable method such as a bonding method or an epitaxial growth method and it is used as an SOI (semiconductor on insulator) substrate. In this stage, the alignment mark 13 is formed on the semiconductor layer 12 in advance.

Figure 10B:
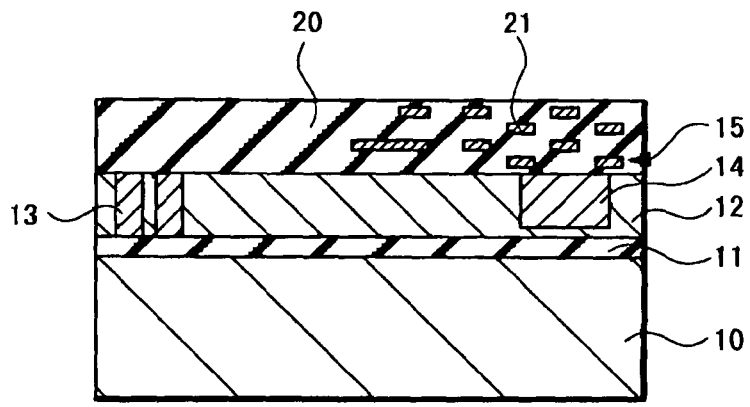

Next, as shown in FIG. 10B, a pn junction is formed by implanting ions of p type conductive impurities on the n type semiconductor layer 12 and thereby the photodiode 14 that serves as the photo-electric conversion element is formed in the semiconductor layer 12. Further, the gate electrode is formed on the surface of the semiconductor layer 12 through the gate insulating film and connected to the photodiode 14 and the like to form the CMOS transistor 15, thereby resulting in a plurality of pixels having the above-described arrangement being formed.

Further, there is formed the interlayer insulator 20 which covers the CMOS transistor, for example. At that time, the buried wiring layer 21 is buried into the interlayer insulator 20 so as to be connected to the transistors and the semiconductor layer 12 and the like.

Figure 10C:
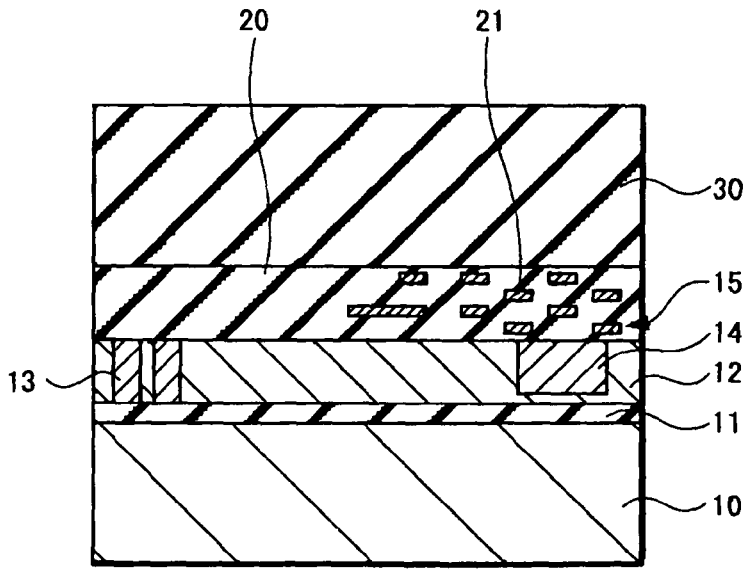

Next, as shown in FIG. 10C, the supporting substrate 30 formed of a suitable material such as a silicon substrate or an insulating resin substrate is bonded to the upper layer of the interlayer insulator 20 by a suitable method such as thermo compression bonding using a thermosetting resin as an adhesive.

Figure 10D:
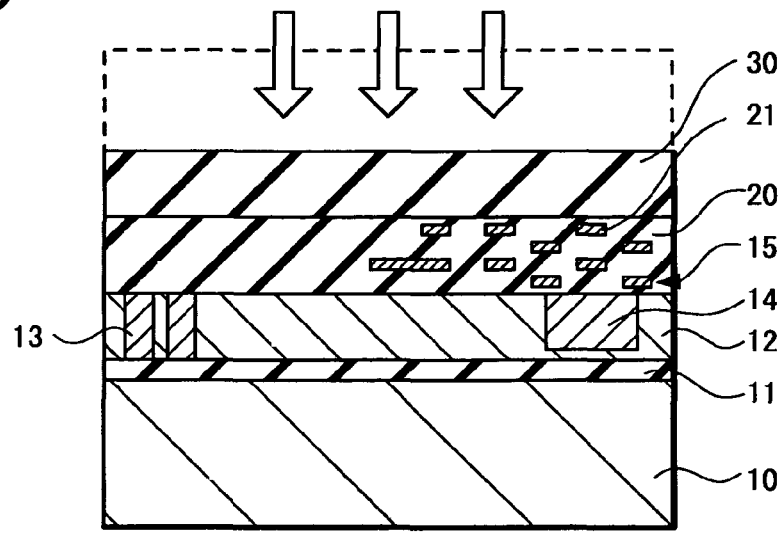

Next, as shown in FIG. 10D, the supporting substrate 30 is decreased in thickness from the opposite side of the bonded surface by a suitable method such as mechanical grinding.

Figure 10E:
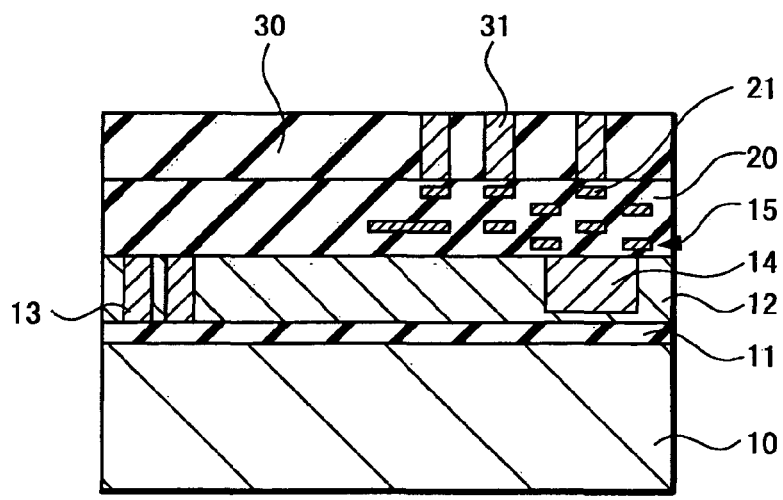

Next, as shown in FIG. 10E, the supporting substrate penetrating wiring 31 that penetrates the supporting substrate 30 is formed so as to be connected to the buried wiring layer 21. This supporting substrate penetrating wiring 31 can be formed in such a manner that a resist film is pattern-formed during a photolithography process, for example, and etched by a suitable method such as dry etching to form an opening portion, which reaches the buried wiring layer 21, on the supporting substrate, whereby the opening portion on the supporting substrate 30 is buried by a low-resistance metal such as copper.

Figure 10F:
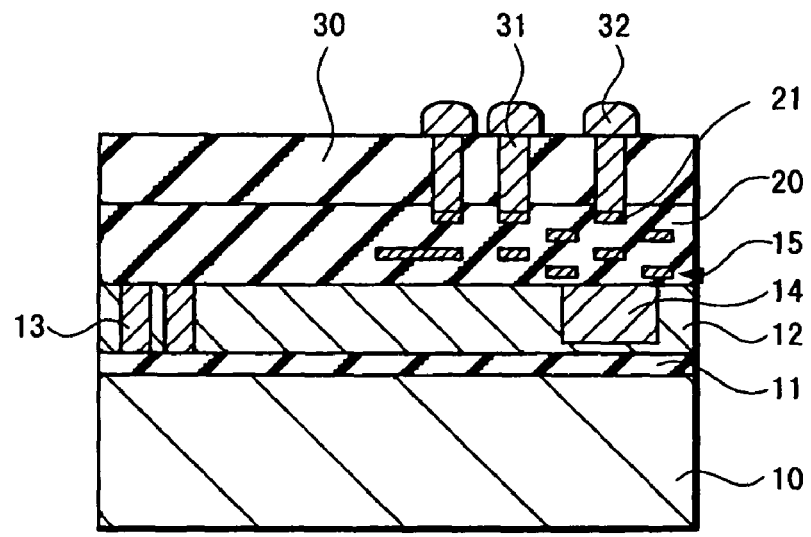

Next, as shown in FIG. 10F, the bump 32, which protrudes from the surface of the supporting substrate 30, is formed on the surface of the supporting substrate penetrating wiring 31 by a suitable method such as a metal plating treatment.

Figure 10G:
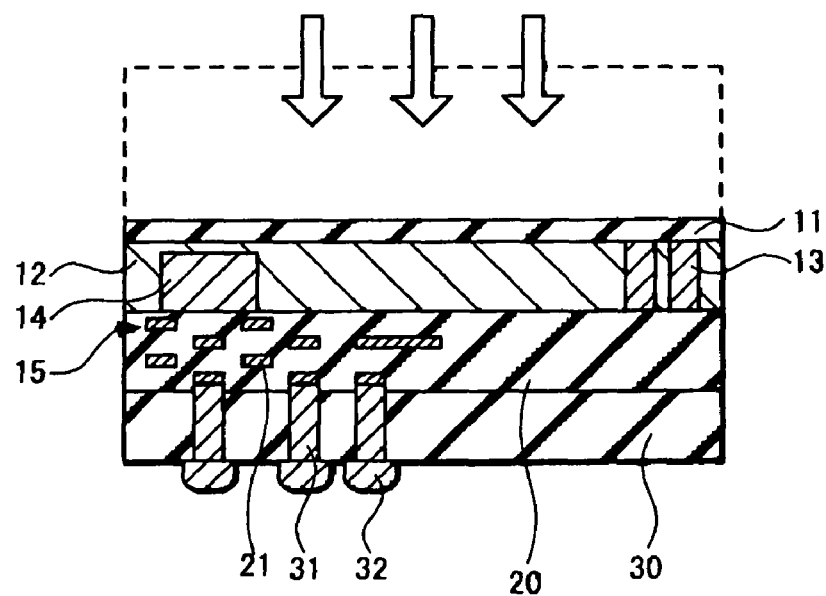

Next, as shown in FIG. 10G, the semiconductor substrate 10 is decreased in thickness until the photodiode 14 becomes able to receive light from the side of the semiconductor substrate 10 of the SOI substrate, for example. For example, the insulating film 11 is used as a stopper and the semiconductor substrate 10 is decreased in thickness from the back surface side of the semiconductor substrate 10 by mechanical grinding or wet etching treatment until the insulating film 11 is exposed. As a result, the semiconductor layer 12 of the SOI substrate is left. Herein, the insulating film 11, which is exposed on the surface, will be referred to as a "surface insulating film". For convenience sake of the sheet of drawing and in order to more clearly understand the present invention, an upper and lower relationship in FIG. 10G is reversed relative to FIG. 10F.

In this manner, there is formed the back-illuminated type CMOS solid-state image pickup device (sensor chip) 1*a* according to this embodiment.

Further, it is preferable that an insulating film should be deposited on the back surface of the semiconductor substrate (semiconductor layer 12), which was obtained by decreasing the thickness of the semiconductor substrate 10, by a CVD method, for example. This insulating film can function not only to protect the silicon surface of the back surface but also to work as an antireflection film against incident light.

The thus formed back-illuminated type CMOS solid-state image pickup device (sensor chip) 1*a* is mounted on the interposer through the bump 32 by flip-chip bonding such that the light-receiving surface is directed upwards. For example, lands and bumps on the wirings of the interposer and bumps on the supporting substrate of the sensor chip may be compression-bonded together at a temperature lower than a melting point of wirings used within the sensor chip and the signal processing chip and also at a temperature in which bumps can be electrically connected together with high stability. Also, the sensor chip can be directly mounted on the signal processing chip as a module. Also in this case, the sensor chip can be mounted on the signal processing chip similarly as described above.

On the other hand, the signal processing chip 2 in which the peripheral circuit unit is formed also is similarly mounted on the interposer through the bump by flip-chip bonding. As a consequence, the back-illuminated type CMOS solid-state image pickup device (sensor chip) 1*a* and the signal processing chip 2 are connected together through the wirings formed on the interposer 3.

In this fashion, it is possible to manufacture the image sensor in which the back-illuminated type CMOS solid-state image pickup device according to this embodiment is assembled. Further, after the back-illuminated type CMOS solid-state image pickup device was mounted on the interposer by flip-chip bonding, the circuits of the sensor chip can be tested by using the alignment mark 13.

As described above, according to the method of manufacturing the back-illuminated type CMOS solid-state image pickup device according to this embodiment, since the semiconductor substrate is decreased in thickness after sufficient strength was maintained by bonding the supporting substrate to the semiconductor substrate and the penetrating wiring is formed by decreasing the thickness of the supporting substrate, the electrode is not led out from the back surface of the semiconductor substrate and the electrode can be led out from the supporting substrate. Thus, it is possible to simply and easily manufacture the back-illuminated type CMOS solid-state image pickup device having the arrangement in which the electrode is led out from the surface of the opposite side of the light illuminated surface.

Also, since the electrode can be formed on the supporting substrate side of the opposite side of the surface in which light becomes incident, degree of freedom of the arrangement of the electrode can be increased and hence it becomes possible to form a large number of micro-bumps on the portion right under the pixel and on the portion right under the peripheral portion of the pixel without decreasing an aperture ratio of the CMOS image sensor.

As described above, since the back surface of the semiconductor substrate is decreased in thickness and the mounted substrate such as the interposer and other semiconductor chip such as the signal processing chip are connected together by means of bumps, it becomes possible to manufacture a device with high performance and high capability.

As the semiconductor substrate, it is preferable that an oxide film should be formed in advance in the substrate like the SOI substrate. Such semiconductor substrate is preferable because the oxide film in the SOI substrate can be used as the stopper in the wet etching process to decrease the thickness of the semiconductor substrate and a uniform and flat semiconductor substrate can be obtained after the film thickness of the semiconductor substrate was decreased.

A third embodiment of the present invention will be described below.

Figure 11:
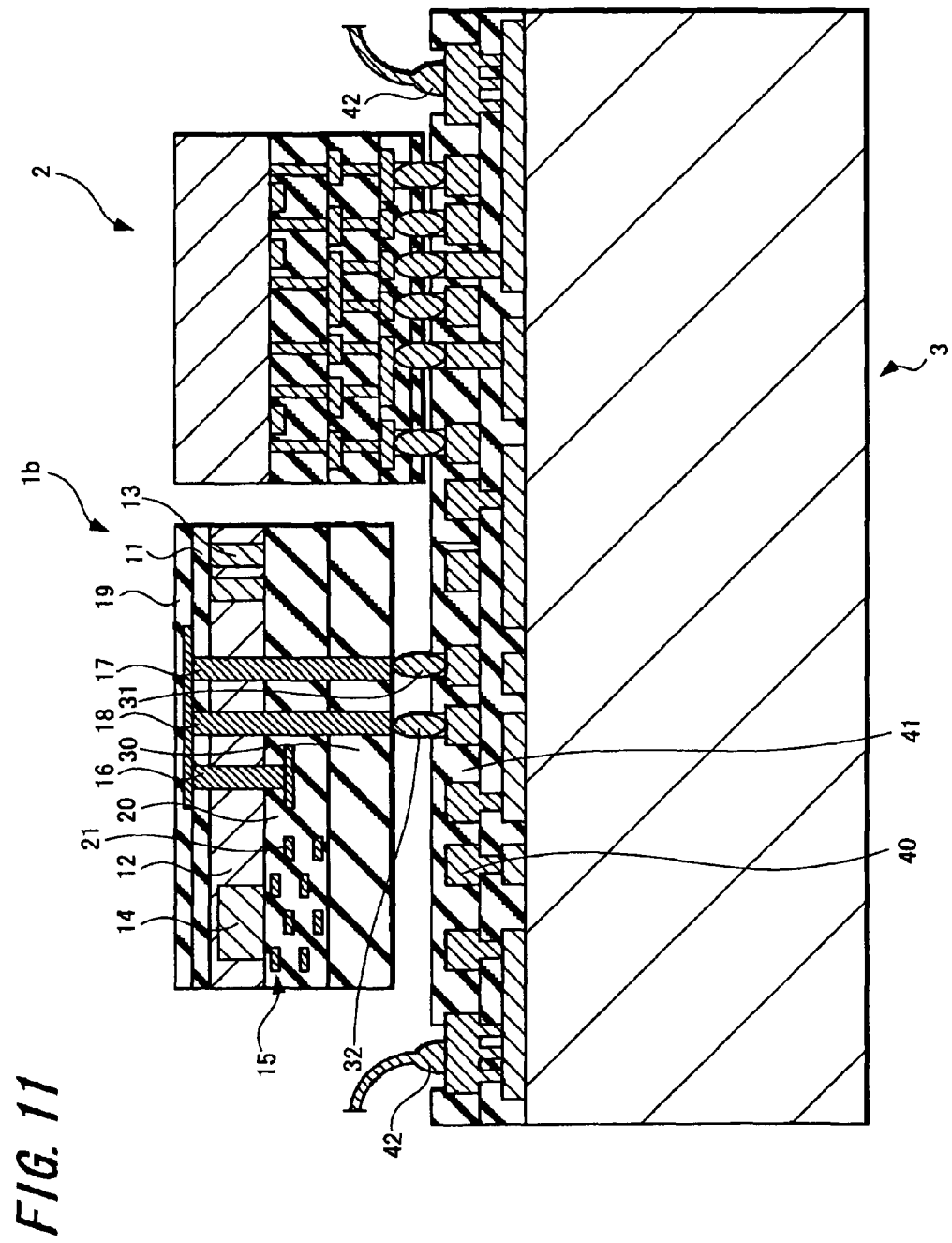
FIG. 11 is a schematic cross-sectional view showing a back-illuminated type CMOS solid-state image pickup device according to a second embodiment of the present invention.

FIG. 11 is a schematic cross-sectional view showing an arrangement of an electronic apparatus in which the back-illuminated type CMOS solid-state image pickup device according to the embodiment of the present invention is mounted.

Similarly to the second embodiment, a sensor chip 1*b*, which is a back-illuminated type CMOS solid-state image pickup device with an image pickup pixel unit provided thereon, and the signal processing chip 2 with the peripheral circuit unit such as the signal processing circuit provided thereon are mounted on the interposer (intermediate substrate) 3, for example.

As shown in FIG. 11, the interlayer insulator 20 is formed on the supporting substrate 30 and the buried wiring layer 21 is buried in the inside of the interlayer insulator 20. The semiconductor layer 12 is formed on the upper layer of the buried wiring layer 21 and the surface insulating films (11, 19) are formed on the surface of the semiconductor layer 12.

The photodiode 14, the alignment mark 13 and the like are formed in the semiconductor layer 12. Also, a part of the buried wiring layer 21 becomes the gate electrode formed on the semiconductor layer 12 through the gate insulating film. Also, there is formed the semiconductor layer penetrating wiring 16 which is connected through the semiconductor layer 12 to the buried wiring layer 21.

Further, a supporting substrate penetrating wiring 31 which penetrates the supporting substrate 30 is formed and a protrusion electrode (bump) 32 which protrudes from the surface of the supporting substrate 30 is formed on the surface of the supporting substrate penetrating wiring 31.

On the other hand, there is formed a semiconductor layer insulating layer penetrating wiring 17 which is connected through the semiconductor layer 12 and the interlayer insulator 20 to the supporting substrate penetrating wiring 31, for example. The semiconductor layer penetrating wiring 16 and the semiconductor layer insulating layer penetrating wiring 17 are connected together by a connection wiring 18 formed on the surface insulating film 11.

While the supporting substrate penetrating wiring 31 is connected through the semiconductor layer insulating layer penetrating wiring 17, the connection wiring 18 and the semiconductor layer penetrating wiring 16 to the buried wiring layer 21 as described above in this embodiment, the present invention is not limited thereto, and the supporting substrate penetrating wiring 31 may be directly connected to the buried wiring layer 21 through part of the above-mentioned elements or not through the above-mentioned elements.

The sensor chip 1*b* having the above-described arrangement has an arrangement in which when light is illuminated on the photodiode 14 formed in the semiconductor layer 12 from the side of the surface insulating films (11, 19), signal electric charges are generated and accumulated in the photodiode 14. This sensor chip 1*b* is the back-illuminated type solid-state image pickup device in which the buried wirings connected to a plurality of pixels are formed on one surface of the semiconductor layer in which a plurality of pixels including the photo-electric conversion element and the field-effect transistor is formed, the surface of the semiconductor layer becoming the light-receiving surface of the photo-electric conversion element.

The above-described sensor chip 1*b* is mounted on the interposer 3 in which wirings 40 and an insulating layer 41 for insulating the wirings 40 are formed from the side of the supporting substrate 30 of the opposite side of the light illuminated side by flip-chip bonding in such a manner that a land, which is provided by exposing a part of the surface of the wiring from the opening portion of the insulating layer, and the bump may be joined.

On the other hand, the signal processing chip 2 with the peripheral circuit unit formed thereon is mounted on the interposer 3 through the bump, for example, by flip-chip bonding.

The electronic apparatus having the above-mentioned arrangement is mounted on other mounted substrate at every interposer and the electronic apparatus are electrically connected by wire bonding 42, for example, when they are in use.

The arrangement of the image sensor in which the back-illuminated type CMOS solid-state image pickup device according to this embodiment is assembled and the arrangement of the pixel are similar to those of the first embodiment.

A method of the back-illuminated type CMOS solid-state image pickup device according to this embodiment will be described.

Figure 12A:
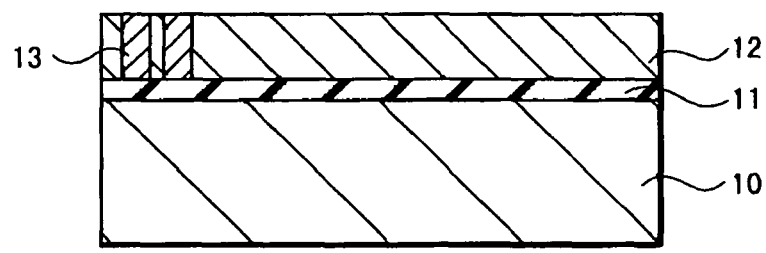
FIG. 12A to 12G are cross-sectional views showing manufacturing processes of the back-illuminated type CMOS solid-state image pickup device according to the second embodiment of the present invention, respectively.

First, as shown in FIG. 12A, the insulating film 11 made of silicon oxide and which will become a surface insulating film in the later process is deposited on the surface of the semiconductor substrate 10 made of silicon and the like, for example, by a suitable method such as a thermal oxidation method or a CVD (chemical vapor deposition) method.

Further, the semiconductor layer 12 formed of a suitable material such as silicon is deposited on the upper layer of the insulating film 11, for example, by a suitable method such as a bonding method or an epitaxial growth method and it is used as an SOI (semiconductor on insulator) substrate. In this stage, the alignment mark 13 is formed on the semiconductor layer 12 in advance.

Figure 12B:
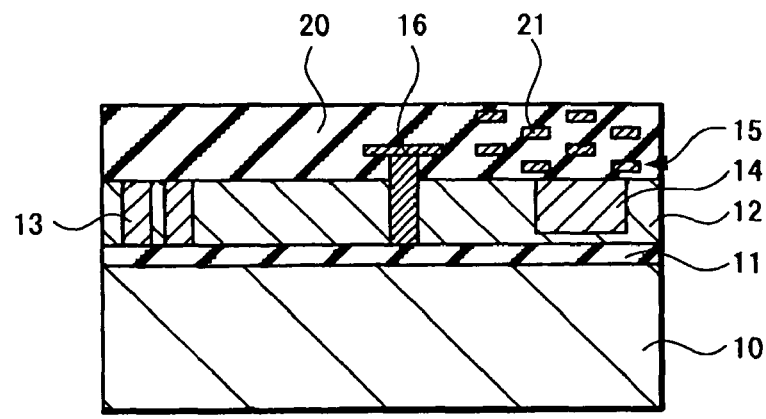

Next, as shown in FIG. 12B, the photodiode 14 is formed in the semiconductor layer 12 as the photo-electric conversion element by implanting ions of conductive impurities. Further, the gate electrode is formed on the surface of the semiconductor layer 12 through the gate insulating film and connected to the photodiode 14 and the like to form the CMOS transistor 15, thereby resulting in a plurality of pixels having the above-described arrangement being formed.

Further, there is formed the interlayer insulator 20 which covers the CMOS transistor, for example. At that time, the buried wiring layer 21 is buried into the interlayer insulator 20 so as to be connected to the transistors and the semiconductor layer 12 and the like.

Figure 12C:
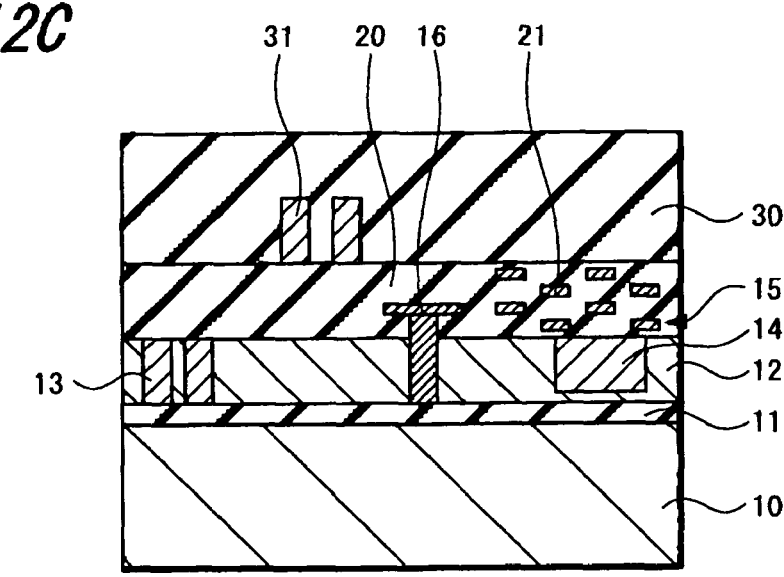

On the other hand, the supporting substrate wiring 31 which becomes the supporting substrate penetrating wiring that reaches from the surface of one principal plane of the supporting substrate formed of the silicon substrate or the insulating resin substrate to at least a predetermined depth is formed. Next, as shown in FIG. 12C, the supporting substrate 30 is bonded to the upper layer of the interlayer insulator 20 from the side of the surface on which the supporting substrate wiring 31 is formed.

Figure 12D:
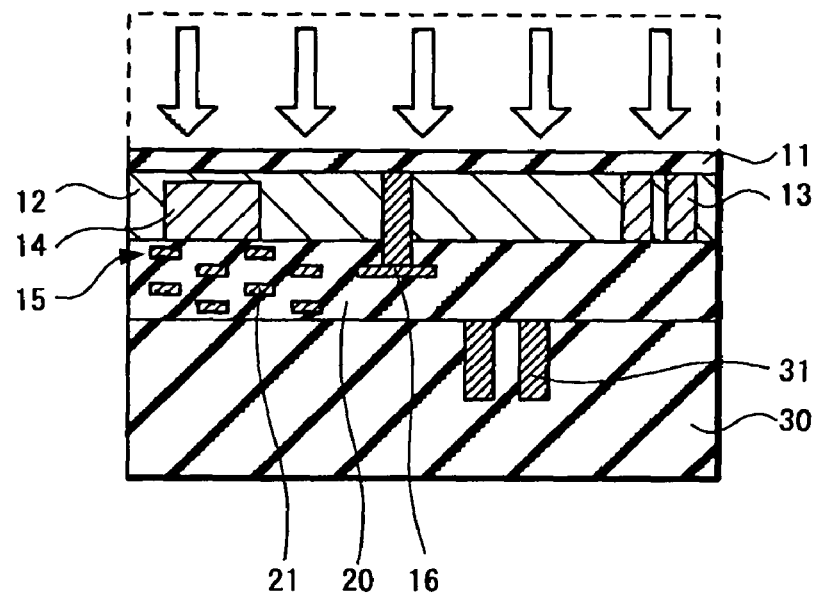

Next, as shown in FIG. 12D, the semiconductor substrate 10 is decreased in thickness until the photodiode 14 becomes able to receive light from the side of the semiconductor substrate 10 of the SOI substrate, for example. The insulating film 11 is used as a stopper, for example, and the semiconductor substrate 10 is decreased in thickness from the back surface side of the semiconductor substrate 10 by mechanical grinding or wet etching treatment until the insulating film 11 is exposed. As a result, the semiconductor layer 12 of the SOI substrate is left. For convenience sake of the sheet of drawing and in order to more clearly understand the present invention, an upper and lower relationship in FIG. 12D is reversed relative to FIG. 12C.

Figure 12E:
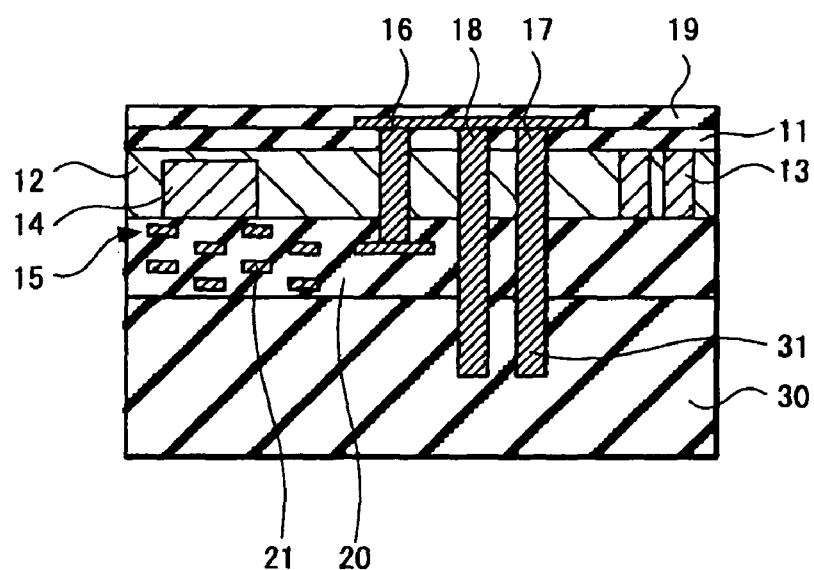

Next, as shown in FIG. 12E, there is formed a connection wiring by which the supporting substrate wiring 31 and the buried wiring layer 21 can be connected together.

To be more concrete, there is formed the semiconductor layer penetrating wiring 16 which is connected through the semiconductor layer 12 to the buried wiring layer 21, for example, there is formed the semiconductor layer insulating layer penetrating wiring 17 which is connected through the semiconductor layer 12 and the interlayer insulator 20 to the supporting substrate penetrating wiring 31 and there is formed the connection wiring 18 by which the semiconductor layer penetrating wiring 16 and the semiconductor layer insulating layer penetrating wiring 17 are connected together. After that, the surface insulating film 19 which becomes the protecting film is formed.

Figure 12F:
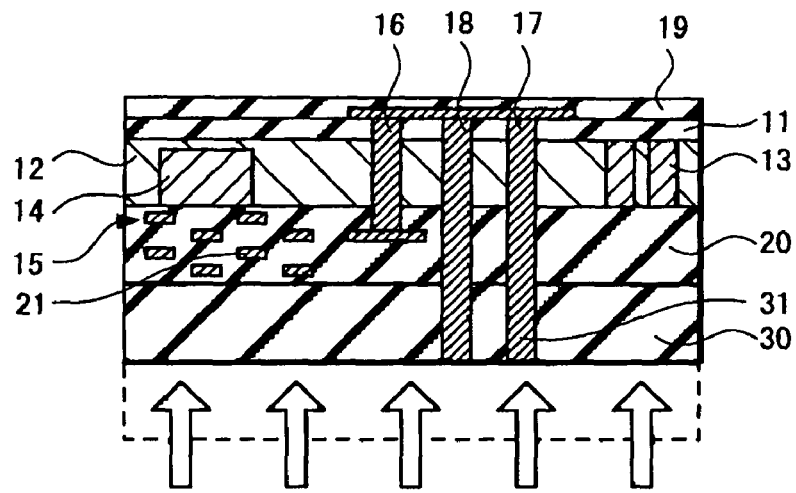

Next, as shown in FIG. 12F, the supporting substrate 30 is decreased in thickness from the opposite side of the bonded surface by a suitable method such as mechanical grinding until the supporting substrate wiring 31 is exposed, and the supporting substrate wiring 31 is used the supporting substrate penetrating wiring which penetrates the supporting substrate 30.

Figure 12G:
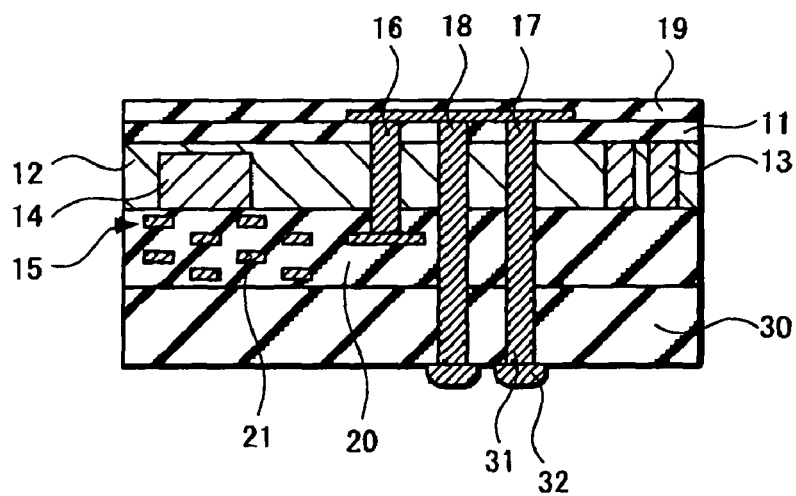

Next, as shown in FIG. 12G, the bump 32, which protrudes from the surface of the supporting substrate 30, is formed on the surface of the supporting substrate penetrating wiring 31 by a suitable treatment such as a metal plating treatment.

As described above, there can be obtained the back-illuminated type CMOS solid-state image pickup device (sensor chip) 1b according to this embodiment.

The thus formed back-illuminated type CMOS solid-state image pickup device (sensor chip) 1b is mounted on the interposer 3 through the bump 32 by flip-chip bonding in such a manner that the light-receiving surface is directed in the upper direction. The signal processing chip 2 also is similarly mounted on the interposer 3 by flip-chip bonding, and the back-illuminated type CMOS solid-state image pickup device(sensor chip) 1b and the signal processing chip 2 are connected together through the wirings formed on the interposer 3.

In this manner, it is possible to manufacture the image sensor in which the back-illuminated type CMOS solid-state image pickup device according to this embodiment is mounted.

In this embodiment, the buried wiring formed on the semiconductor substrate and the penetrating electrode in the supporting substrate are not directly connected but the penetrating electrode and the buried wiring may be connected by wirings after the back surface of the semiconductor substrate was decreased in thickness. According to this method, since the penetrating electrode and the buried wiring are connected by the signal processing device and the micro-bump formed on the back surface of the supporting substrate so that wire bonding need not be carried out, the size in which the back-illuminated type CMOS solid-state image pickup device is formed as one chip can be reduced much more.

As described above, according to the method of manufacturing the back-illuminated type CMOS solid-state image pickup device of this embodiment, since the semiconductor substrate is decreased in thickness after sufficient strength was maintained by bonding the supporting substrate to the semiconductor substrate and the penetrating wiring is formed by decreasing the thickness of the supporting substrate, it is possible to simply and easily manufacture the back-illuminated type CMOS solid-state image pickup device having the arrangement in which the electrode is led out from the surface of the opposite side of the light-illuminated surface.

As described above, in the CMOS image sensor in which the CMOS solid-state image pickup device according to this embodiment is mounted, it becomes possible to directly input the signal outputted from the pixel to the signal processing device through the micro-bump at every unit of pixel or at every unit of a plurality of pixels. As a consequence, it becomes possible to provide a high performance device with high capability in which a signal processing speed among the devices is high and in which the image sensor and the signal processing device are formed as one chip. Also, since this image sensor need not be connected to the chip or wafer by wire bonding, the chip size can be reduced, a yield of wafer can be increased and a chip cost can be decreased.

The present invention is not limited to the above-described embodiments.

For example, while the SOI substrate is used as the semiconductor substrate in the above-described embodiments, the present invention is not limited thereto and an ordinary semiconductor substrate can be used and this semiconductor substrate can be decreased in thickness from the surface of the opposite side of the surface in which the photodiode and the transistor are formed.

Further, the bump, which protrudes from the surface of the supporting substrate, can be formed on the whole of the chip area. For example, independent bumps can be formed at every pixel of the CMOS image sensor and connected to a suitable element such as the interposer, whereby signal electric charges can be read out at every pixel.

Furthermore, the present invention can be variously modified without departing from the gist of the present invention.

According to the solid-state image pickup device and the camera of the present invention, the solid-state image pickup device and the camera are composed of the back-illuminated type solid-state image pickup device, wherein electric charges generated from the photo-electric conversion region portion formed under at least a part of the read circuit are collected to the electric charge accumulation region of the photo-electric conversion element by the electric field formed within the photo-electric conversion element, whereby a saturation electric charge amount can be increased. On the other hand, since the portion provided under the read circuit also is formed as the photo-electric conversion element, the incident light area in which light is introduced from the other surface of the substrate can be increased and hence sensitivity of the solid-state image pickup device and the camera can be improved. Accordingly, it becomes possible to make the pixel size become very small in accordance with increase of integration degree of pixel without lowering a saturation electric charge amount and sensitivity.

The potential distribution of which potential is increased from the photo-electric conversion region portion to the electric charge accumulation region is formed between the above-described photo-electric conversion region portion and the electric charge accumulation region within the photo-electric conversion element, whereby electric charges can be moved from the photo-electric conversion region portion and accumulated in the electric charge accumulation region efficiently.

The potential distribution of which potential is increased toward the other plane of the substrate or one plane in the substrate depth direction of the photo-electric conversion element, whereby electric charges generated within the photo-electric conversion element can be efficiently moved to and accumulated in the electric charge accumulation region which depends on one plane.

Also, according to the method of manufacturing a solid-state image pickup device and a camera of the present invention, since the semiconductor substrate is decreased in thickness after the supporting substrate was bonded to the semiconductor substrate to maintain sufficient strength and the supporting substrate is decreased in thickness to form the penetrating wirings, it is possible to simply and easily manufacture the back-illuminated type CMOS solid-state image pickup device and the camera having the arrangement in which the electrode is led out from the surface of the opposite side of the light illuminated surface.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device comprising:
   a first semiconductor region (1052b) of a first conductivity type between an electric charge accumulation region (1052a) of the first conductivity type and a second semiconductor region (1052c) of the first conductivity type;
   a third semiconductor region (1052c1) of the first conductivity type between a semiconductor well region (1046) of a second conductivity type and said second semiconductor region (1052c),
   wherein an impurity concentration of the first conductivity type for said electric charge accumulation region (1052a) is higher than an impurity concentration of the first conductivity type for said third semiconductor region (1052c1),
   wherein an impurity concentration of the first conductivity type for said first semiconductor region (1052b) is higher than an impurity concentration of the first conductivity type for said electric charge accumulation region (1052a).

2. A solid-state image pickup device according to claim 1, wherein the conductivity of the first conductivity type is opposite to the conductivity of the second conductivity type.

3. A solid-state image pickup device according to claim 1, wherein said first semiconductor region (1052b), said third semiconductor region (1052c1) and said second semiconductor region (1052c) are bordered by pixel separation regions (1043) of the second conductivity type.

4. A solid-state image pickup device according to claim 3, wherein an impurity concentration of the second conductivity type for said pixel separation regions (1043) decreases from a back surface side of a substrate to a substrate surface side of the substrate.

5. A solid-state image pickup device comprising:
   a first semiconductor region (1052b) of a first conductivity type between an electric charge accumulation region (1052a) of the first conductivity type and a second semiconductor region (1052c) of the first conductivity type;
   a third semiconductor region (1052c1) of the first conductivity type between a semiconductor well region (1046) of a second conductivity type and said second semiconductor region (1052c),
   wherein an impurity concentration of the first conductivity type for said electric charge accumulation region (1052a) is higher than an impurity concentration of the first conductivity type for said third semiconductor region (1052c1),
   wherein a channel region (1055) is between an accumulation layer (1053) of the second conductivity type and said semiconductor well region (1046), an impurity concentration of the accumulation layer (1053) decreasing toward said channel region (1055).

6. A solid-state image pickup device comprising:
   a first semiconductor region (1052b) of a first conductivity type between an electric charge accumulation region (1052a) of the first conductivity type and a second semiconductor region (1052c) of the first conductivity type;
   a third semiconductor region (1052c1) of the first conductivity type between a semiconductor well region (1046) of a second conductivity type and said second semiconductor region (1052c),
   wherein an impurity concentration of the first conductivity type for said electric charge accumulation region (1052a) is higher than an impurity concentration of the first conductivity type for said third semiconductor region (1052c1),
   wherein a channel region (1055) is between an accumulation layer (1053) of the second conductivity type and said semiconductor well region (1046),
   wherein an impurity concentration of the second conductivity type for the accumulation layer (1053) decreases toward said channel region (1055).

7. A solid-state image pickup device according to claim 5, wherein said electric charge accumulation region (1052a) is between said accumulation layer (1053) and said first semiconductor region (1052b).

8. A solid-state image pickup device according to claim 5, wherein said channel region (1055) is between a source/drain region (1047, 1049) of the first conductivity type and said electric charge accumulation region (1052a), said source/drain region (1047, 1049) being within said semiconductor well region (1046).

9. A solid-state image pickup device according to claim 5, wherein said channel region (1055) is between a region portion (1056) of the first conductivity type and a gate electrode (1048).

10. A solid-state image pickup device according to claim 9, wherein said region portion (1056) is between said electric charge accumulation region (1052a) and said semiconductor well region (1046).

11. A solid-state image pickup device according to claim 9, wherein said region portion (1056) is between said channel region (1055) and said first semiconductor region (1052b).

12. A solid-state image pickup device according to claim 5, wherein said second semiconductor region (1052c) is between an accumulation layer (1054) of the second conductivity type and said accumulation layer (1053).

13. A solid-state image pickup device according to claim 5, wherein incident light upon said accumulation layer (1054) is convertible into a signal.

14. A camera including the solid-state image pickup device of claim 1.

15. A method of manufacturing the solid-state image pickup device of claim 1, the method comprising the steps of:
   forming the second semiconductor region (1052c);
   forming the first semiconductor region (1052b) and the third semiconductor region (1052c1);
   forming the electric charge accumulation region (1052a); and
   forming the semiconductor well region (1046).

16. A method of manufacturing a camera comprising the method according to claim 15.

* * * * *